United States Patent
Hayashi et al.

(10) Patent No.: US 9,654,716 B2
(45) Date of Patent: May 16, 2017

(54) IMAGE PICKUP APPARATUS, IMAGE PICKUP SYSTEM, DRIVING METHOD FOR THE IMAGE PICKUP APPARATUS, AND INSPECTION METHOD FOR THE IMAGE PICKUP APPARATUS

(71) Applicant: CANON KABUSHIKI KAISHA, Tokyo (JP)

(72) Inventors: Hidetoshi Hayashi, Fujisawa (JP); Hiroki Hiyama, Sagamihara (JP); Tetsuya Itano, Sagamihara (JP); Toshiaki Ono, Ebina (JP); Tatsuhiko Yamazaki, Zama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/949,359

(22) Filed: Nov. 23, 2015

(65) Prior Publication Data

US 2016/0156865 A1 Jun. 2, 2016

(30) Foreign Application Priority Data

Nov. 28, 2014 (JP) .................................. 2014-242527

(51) Int. Cl.
| | |
|---|---|
| *H04N 5/378* | (2011.01) |
| *H04N 5/367* | (2011.01) |
| *H04N 5/3745* | (2011.01) |
| *H03M 1/12* | (2006.01) |

(52) U.S. Cl.
CPC ............ *H04N 5/378* (2013.01); *H03M 1/123* (2013.01); *H04N 5/367* (2013.01); *H04N 5/37455* (2013.01)

(58) Field of Classification Search
CPC ........ H04N 5/378; H04N 5/367; H04N 5/335; H04N 5/3742; H04N 5/37455; H04N 5/3745; H04N 5/37452; H04N 5/3765; H03M 1/123; H03M 1/56; H03M 1/1019; H03M 1/12; H03M 1/14; G11C 29/24
See application file for complete search history.

(56) References Cited

U.S. PATENT DOCUMENTS

| | | | | |
|---|---|---|---|---|
| 6,870,565 | B1 * | 3/2005 | Blerkom ................ | H04N 5/335 348/294 |
| 8,035,717 | B2 * | 10/2011 | Hisamatsu ........... | H03K 23/548 348/302 |
| 8,259,206 | B1 * | 9/2012 | Shibata .................. | H04N 5/378 250/208.1 |
| 8,269,872 | B2 * | 9/2012 | Okumura ............... | H04N 5/355 341/164 |

(Continued)

FOREIGN PATENT DOCUMENTS

| | | |
|---|---|---|
| EP | 1566891 A2 | 8/2005 |
| EP | 2117228 A1 | 11/2009 |

(Continued)

*Primary Examiner* — Michael Osinski
(74) *Attorney, Agent, or Firm* — Canon USA, Inc. IP Division

(57) ABSTRACT

The present invention relates to a technology for providing a selection unit configured to perform selection of a bit memory that holds a signal of a first bit of a digital signal from among a plurality of bit memories commonly in a memory unit in each of a plurality of AD conversion units.

26 Claims, 17 Drawing Sheets

(56) References Cited

U.S. PATENT DOCUMENTS

| | | | |
|---|---|---|---|
| 8,325,252 B2* | 12/2012 | Shoyama | H04N 5/376 348/241 |
| 8,446,506 B2* | 5/2013 | Nakamura | H04N 5/378 348/302 |
| 8,618,461 B2* | 12/2013 | Doi | H04N 5/378 250/208.1 |
| 8,717,838 B1 | 5/2014 | Mishi | |
| 9,438,837 B2* | 9/2016 | Ono | H04N 5/37455 |
| 9,445,027 B2* | 9/2016 | Honda | H04N 5/367 |
| 9,448,109 B2* | 9/2016 | Kameyama | G01J 1/44 |
| 9,509,925 B2* | 11/2016 | Choo | H04N 5/3355 |
| 9,544,559 B2* | 1/2017 | Sekine | H04N 9/64 |
| 2006/0232691 A1* | 10/2006 | Watanabe | G06T 7/0002 348/246 |
| 2007/0024731 A1* | 2/2007 | Muramatsu | H03M 1/1019 348/308 |
| 2009/0237534 A1* | 9/2009 | Okumura | H03M 1/1019 348/294 |
| 2010/0289931 A1* | 11/2010 | Shibata | H04N 5/378 348/294 |
| 2011/0102650 A1* | 5/2011 | Shoyama | H04N 5/376 348/247 |
| 2011/0304755 A1* | 12/2011 | Kondo | H04N 5/378 348/294 |
| 2013/0015329 A1* | 1/2013 | Iwaki | H04N 5/3765 250/208.1 |
| 2013/0063627 A1* | 3/2013 | Hashimoto | H04N 5/3742 348/241 |
| 2013/0161488 A1 | 6/2013 | Doi | |
| 2014/0347518 A1* | 11/2014 | Tanaka | H04N 5/335 348/231.99 |
| 2015/0042856 A1* | 2/2015 | Nakamura | H04N 5/378 348/297 |
| 2015/0201144 A1* | 7/2015 | Kobayashi | H04N 5/378 348/308 |
| 2015/0237277 A1* | 8/2015 | Honda | H04N 5/367 348/302 |
| 2015/0288904 A1* | 10/2015 | Kizuna | H04N 5/378 250/208.1 |
| 2015/0326808 A1* | 11/2015 | Sekine | H04N 5/378 348/294 |
| 2016/0028980 A1* | 1/2016 | Kameyama | H04N 5/378 348/294 |
| 2016/0182845 A1* | 6/2016 | Hagihara | H03M 1/12 348/301 |
| 2016/0309107 A1* | 10/2016 | Sumitani | H04N 5/3742 |

FOREIGN PATENT DOCUMENTS

| | | |
|---|---|---|
| JP | 2012060334 A | 3/2012 |
| RU | 2429585 C2 | 9/2011 |

\* cited by examiner

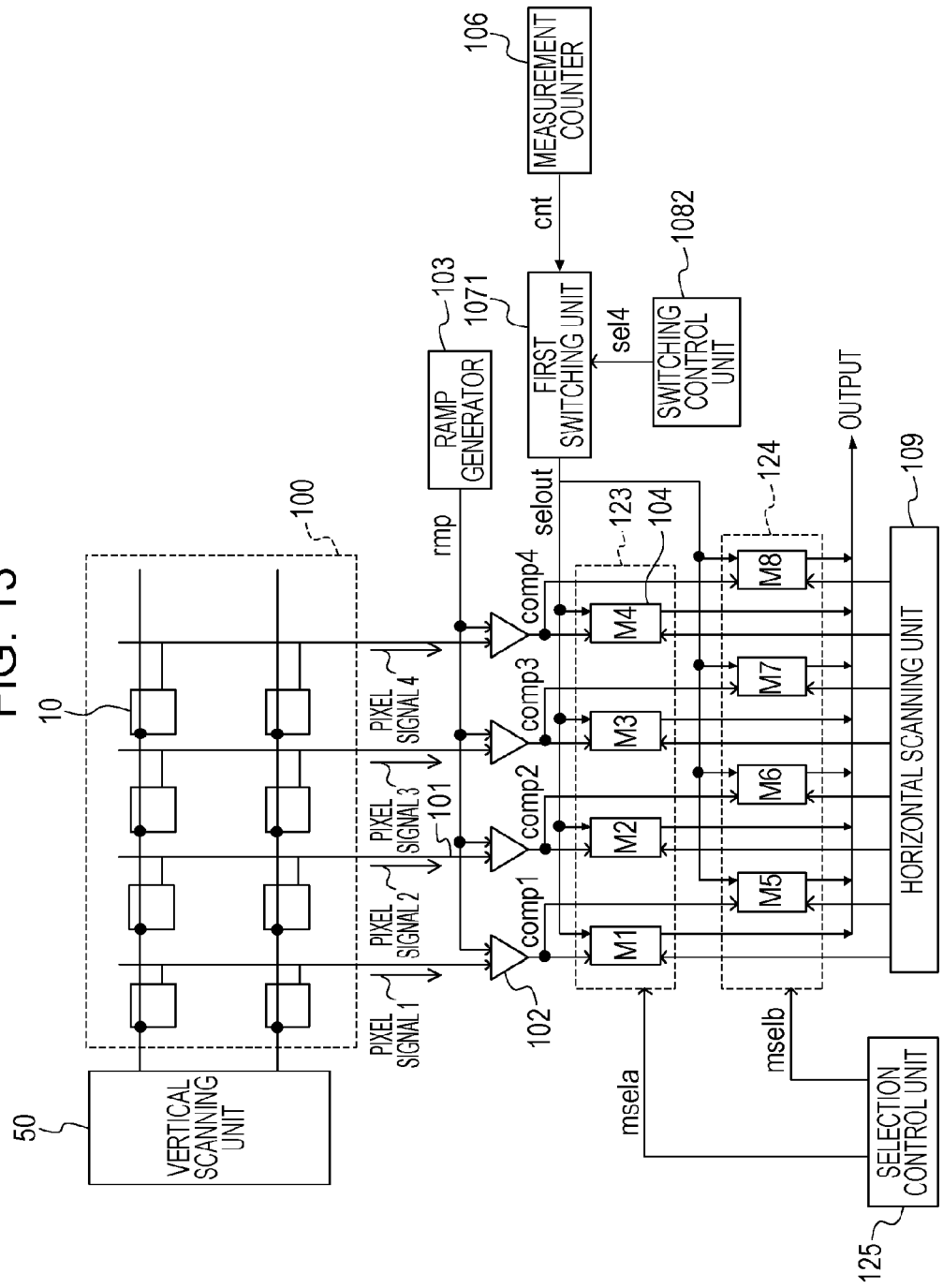

IMAGE PICKUP APPARATUS, IMAGE PICKUP SYSTEM, DRIVING METHOD FOR THE IMAGE PICKUP APPARATUS, AND INSPECTION METHOD FOR THE IMAGE PICKUP APPARATUS

BACKGROUND OF THE INVENTION

Field of the Invention

The present invention relates to an image pickup apparatus, an image pickup system, a driving method for the image pickup apparatus, and an inspection method for the image pickup apparatus.

Description of the Related Art

An image pickup apparatus including a plurality of pixels arranged in a matrix and a plurality of analog-to-digital (AD) conversion units respectively corresponding to columns where the plurality of pixels are arranged has been proposed.

The image pickup apparatus described in Japanese Patent Laid-Open No. 2012-60334 includes a plurality of column AD circuits, each including a data holding unit and a data switching unit. When a defect is detected by the data holding unit, the data switching unit of each of the column AD circuits performs bit shift of data to be output to the data holding unit, so that a deficit of the data caused by the defect in the data holding unit hardly occurs.

In the image pickup apparatus described in Japanese Patent Laid-Open No. 2012-60334, since the data switching unit is provided to each of the plurality of column AD circuits to suppress a decrease in image quality, a problem occurs that the circuit area of the plurality of column AD circuits is increased.

SUMMARY OF THE INVENTION

According to an aspect of the present invention, there is provided an image pickup apparatus including: a plurality of pixels arranged in rows and columns, each of the pixels outputting a photoelectric conversion signal based on incident light; a plurality of AD conversion units, each of the AD conversion units being provided to correspond to a column of the plurality of pixels and configured to convert the photoelectric conversion signal into a plural-bit digital signal; and a selection unit, in which each of the plurality of AD conversion units includes a memory unit that holds the digital signal, the memory unit includes a first bit memory and a second bit memory, and the selection unit performs selecting a bit memory that holds the signal of a first bit of the digital signal, from among the first bit memory and the second bit memory, commonly in the memory unit in each of the plurality of AD conversion units.

Further features of the present invention will become apparent from the following description of exemplary embodiments with reference to the attached drawings.

BRIEF DESCRIPTION OF THE DRAWINGS

FIG. 13 illustrates an example configuration of the image pickup apparatus.

DESCRIPTION OF THE EMBODIMENTS

Hereinafter, respective exemplary embodiments will be described with reference to the drawings.

First Exemplary Embodiment

Figure 1:
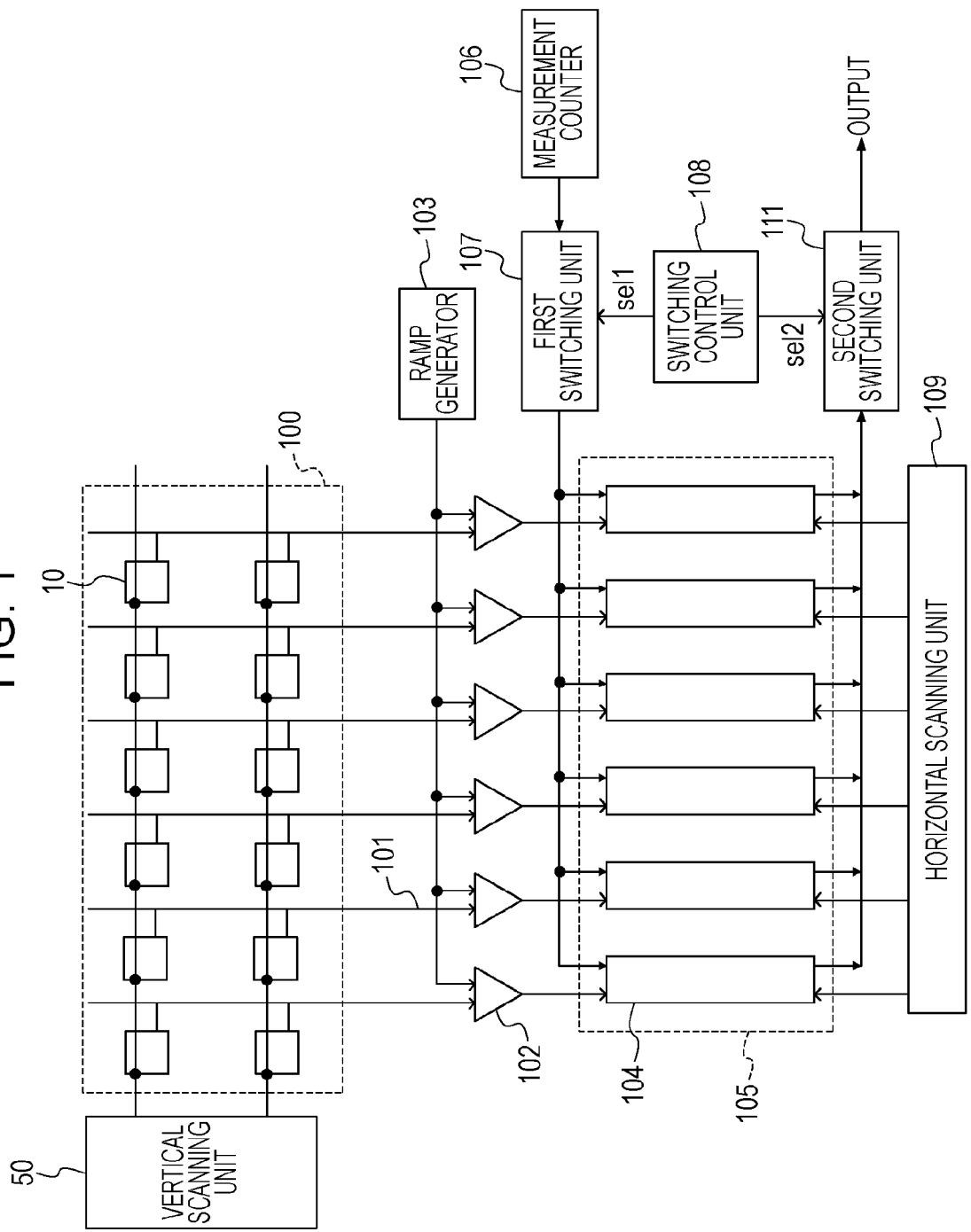
FIG. 1 illustrates an example configuration of an image pickup apparatus.

FIG. 1 illustrates a configuration of the image pickup apparatus according to the present exemplary embodiment. A plurality of pixels 10 are arranged in rows and columns in a pixel portion 100. A vertical scanning unit 50 scans the pixels 10 in the pixel portion 100 by each row.

Each of the plurality of pixels 10 outputs a photoelectric conversion signal based on incident light to a vertical signal line 101 on each column in accordance with scanning of the vertical scanning unit 50. A comparator 102 outputs a comparison result signal indicating a result of the comparison between the photoelectric conversion signal and a ramp signal output from a ramp generator 103 to a memory unit 104. The ramp signal is a signal having a potential that changes depending on time. The memory unit 104 on each column includes six bit memories that hold a G-bit digital signal and a single redundant bit memory. The redundant bit memory is a bit memory constituting a part of a plurality of bit memories provided to the memory unit 104. The redundant bit memory is also a bit memory that holds a predetermined-bit signal of a count signal. An AD conversion unit of the image pickup apparatus according to the present exemplary embodiment is constituted by the comparator 102 and the memory unit 104. That is, each of a plurality of AD conversion units is provided so as to correspond to a column where the pixels 10 are arranged. A holding unit 105 includes the plurality of memory units 104.

Clock signals are input to a measurement counter 106 from a timing generator that is not illustrated in the drawing. The measurement counter 106 generates a 6-bit count signal obtained by counting the number of clocks. The count signal is supplied commonly to the plurality of memory units 104 from the measurement counter 106 via a first switching unit 107. The first switching unit 107 is a selection unit configured to select a bit memory that holds a first-bit signal of the count signal corresponding to a digital signal from among the plurality of bit memories commonly in the memory unit 104 in each of the plurality of AD conversion units. Furthermore, the selection unit according to the present exemplary embodiment includes a switching control unit 108.

The first switching unit 107 is controlled by a signal sel1 output from the switching control unit 108.

The measurement counter 106 starts to measure the number of clocks in synchronism with a state in which the ramp generator 103 starts to change a potential of the ramp signal which depends on the time. The measurement counter 106 also outputs the count signal obtained by the measurement to the first switching unit 107. When a magnitude relationship between the potential of the ramp signal and a potential of the photoelectric conversion signal is changed, the comparator 102 changes a signal value of the comparison result signal. The memory unit 104 on each column holds the count signal output from the first switching unit 107 at a timing at which the signal value of the comparison result signal is changed. Thereafter, the ramp generator 103 ends the change in the potential of the ramp signal which depends on the time. The measurement counter 106 also ends the measurement of the number of clocks. Accordingly, the memory unit 104 on each column holds the count signal based on the potential of the photoelectric conversion signal. The count signal held in the memory unit 104 on each column is the digital signal obtained by the AD conversion of the photoelectric conversion signal.

A horizontal scanning unit 109 sequentially scans the memory unit 104 on each column. With the scanning by the horizontal scanning unit 109, the digital signal is sequentially output from the memory unit 104 on each column to a second switching unit 111.

The second switching unit 111 is controlled by a signal sel2 output from the switching control unit 108. The second switching unit 111 is an output unit configured to output a signal obtained by processing the digital signal output from the memory unit 104 on each column to an external part of the image pickup apparatus. The second switching unit 111 performs an operation of rearranging the order of the plurality of bits of the count signal output from the memory unit 104.

Figure 2A:
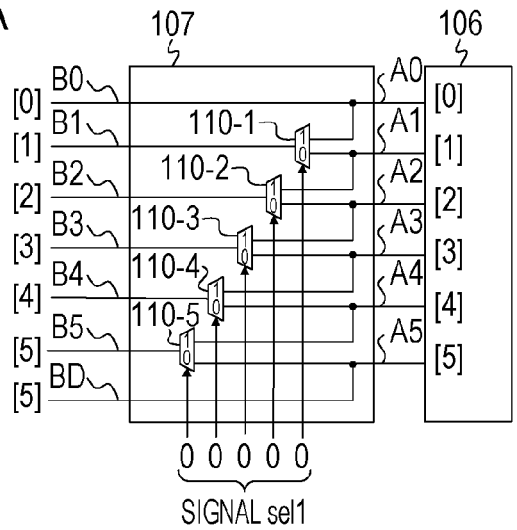
FIG. 2A illustrates configurations and operations of a first switching unit and a measurement counter.
Figure 2B:
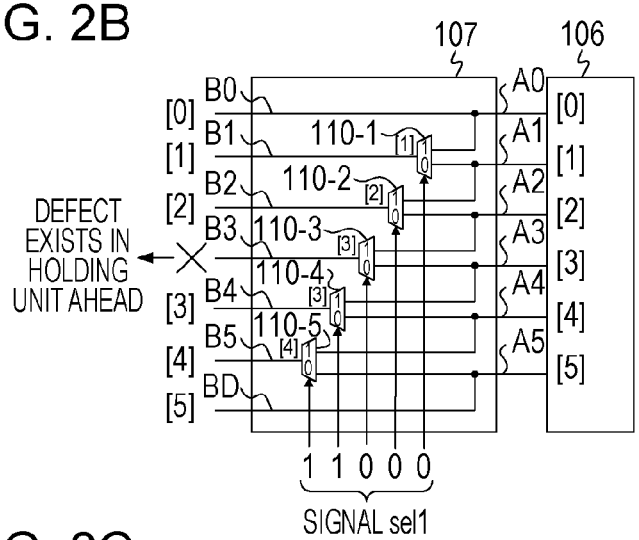
FIG. 2B illustrates the configurations and the operations of the first switching unit and the measurement counter.
Figure 2C:
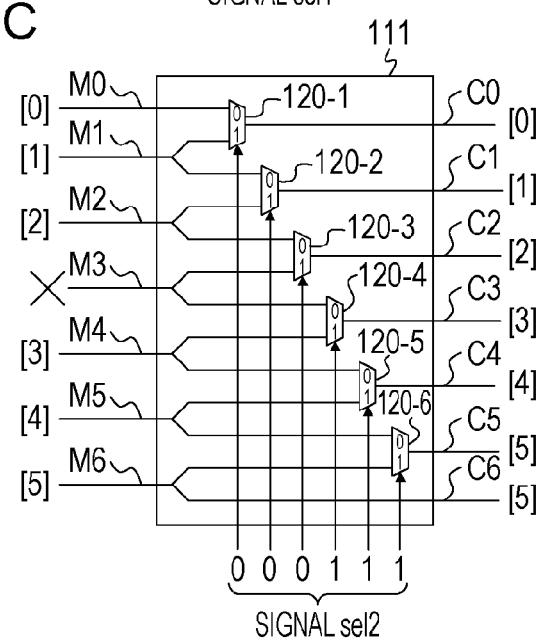
FIG. 2C illustrates a configuration and an operation of a second switching unit.

FIG. 2A, FIG. 2B, and FIG. 2C collectively illustrate configurations and operations of the measurement counter 106 and the first switching unit 107.

FIG. 2A illustrates an operation in a case where no defect exists in the memory units 104 on the plurality of columns in the holding unit 105. FIG. 2B illustrates an operation in a case where a defect exists in a bit memory that holds a bit [3] signal of at least one memory unit 104 among the memory units 104 on the plurality of columns in the holding unit 105. The configurations and operations of the measurement counter 106 and the first switching unit 107 will be described with reference to FIG. 2A.

The measurement counter 106 sequentially outputs 6-bit signals corresponding to bits [0] to [5] of the count signal to respective data lines A0 to A5. The bits [0] to [5] of the count signal are arranged from a lower order bit to a higher order bit in the stated order. The first switching unit 107 includes selection circuits 110-1 to 110-5. The signal sel1 is input to the respective selection circuits 110-1 to 110-5 from the switching control unit 108. The selection circuits 110-1 to 110-5 sequentially respectively output the count signal to data lines B0 to B5 on the basis of the signal value of the signal sel1. The data lines B0 to B5 are respectively connected to the six bit memories provided to the memory unit 104 on each column. A data line BD is connected to the redundant bit memory provided to each of the memory units 104 on the plurality of columns. The data lines B0 to B5 and the data line BD are commonly connected to the plurality of memory units 104.

In FIG. 2A, the signal value of the signal sel1 is (00000) in the stated order from the selection circuit 110-5 to the selection circuit 110-1. In FIG. 2A, with respect to each of the selection circuits 110-1 to 110-5, the data line selected in accordance with the signal value of the signal sel1 is represented by codes 0 and 1. For example, when the signal sel1 having the value of 0 is input, the selection circuit 110-1 outputs the signal of the data line A1 to the data line B1. On the other hand, when the signal sel1 having the value of 1 is input, the selection circuit 110-1 outputs the signal of the data line A0 to the data line B1. Therefore, in a case where the signal value of the signal sel1 is (00000) in the stated order from the selection circuit 110-5 to the selection circuit 110-1, signals of the bits [0] to [5] of the count signal are sequentially respectively output to the data lines B0 to B5 from the first switching unit 107. In addition, the signal of the bit [5] of the count signal is output to the data line BD from the first switching unit 107.

FIG. 2A illustrates a first operation. In the first operation, the signal of the bit [4] corresponding to the first bit is held in the bit memory connected to the data line B4 corresponding to the first bit memory among the plurality of bit memories. Subsequently, the signal of the bit [5] corresponding to the higher order bit with respect to the first bit by one bit is held in the bit memory connected to the data line B5 which corresponds to the second bit memory among the plurality of bit memories.

Next, the configurations and operations of the measurement counter 106 and the first switching unit 107 will be described with reference to FIG. 2B. The configuration of FIG. 2B is the same as that in FIG. 2A.

FIG. 2B illustrates an operation in a case where a defect exists in one bit memory in at least one of the memory units 104 in the holding unit 105. Herein, a defect exists in the bit memory connected to the data line B3. Detection of the defect is previously performed by inspecting the signal output from the memory unit 104. The switching control unit 108 sets the signal value of the signal sel1 as (11000) in the order from the selection circuit 110-5 to the selection circuit 110-1. Accordingly, the signal of the bit [3] of the count signal which is the same as in the data line B3 is output to the data line B4, and the signal of the bit [4] of the count signal is output to the data line B5 in the memory unit 104 on each column. The signal of the bit [5] of the count signal is output to the data line BD. That is, in the operation of FIG. 2B, the output destinations of the signals of the bits equal to and higher than the bit [3] are shifted to the higher order by one bit each with respect to the operation of FIG. 2A. Accordingly, the signals of the bits [0] to [4] of the count signal are held in the bit memories in the memory unit 104 on each column, and the signal of the bit [5] of the count signal is held in the redundant bit memory. Accordingly, even in a case where the defect exists in the bit memory connected to the data line B3, the signals of the bits [0] to [5] of the count signal are held in the memory unit 104 on each column.

FIG. 2B illustrates a second operation. In the second operation, the signal of the bit [4] corresponding to the first bit is held in the bit memory connected to the data line B5 which corresponds to the second bit memory among the plurality of bit memories. In addition, according to the present exemplary embodiment, as a part of the second operation, the signal of the bit [5] that is the higher order bit by one bit with respect to the signal of the bit [4] corresponding to the first bit is held in the redundant bit memory connected to the data line BD.

Next, the configuration and the operation of the second switching unit 111 will be described with reference to FIG. 2C. The operation of the second switching unit 111 in FIG. 2C represents a case in which the first switching unit 107 performs the operation illustrated in FIG. 2B.

The second switching unit 111 includes selection circuits 120-1 to 120-6. In FIG. 2C, with regard to each of the selection circuits 120-1 to 120-6, the data line selected in accordance with a signal value of the signal sel2 output from the switching control unit 108 is represented by codes 0 and 1.

The bit memory connected to the data line B0 is connected to a data line M0 in the memory unit 104 on each column. Hereinafter, similarly, the bit memories connected to the data lines B1 to B5 are respectively connected to data lines M1 to M5 in the stated order. The redundant bit memory connected to the data line BD is connected to the data line B6.

In accordance with scanning of the horizontal scanning unit 109, the signals of the bits [0] to [5] of the count signal are respectively output to the second switching unit 111 via the data lines M0 and M2 and the data lines M4 to M6 from the memory unit 104 on each column. The bit memory connected to the data line M3 does not hold the count signal. For this reason, the count signal is not output to the data line M3 from the memory unit 104.

The switching control unit 108 sets the signal value of the signal sel2 as (000111) in the stated order from the selection circuit 120-1 to the selection circuit 120-6. Accordingly, the signals output to respective data lines C0 to C5 are the signals of the bits [0] to [5] of the count signal in the stated order. The signal output to a data line C6 is the signal of the bit [5] of the count signal. It should be noted that, although not illustrated in the drawing, in a case where the first switching unit 107 performs the operation of FIG. 2A, the switching control unit 108 sets the signal value of the signal sel2 as (000000) in the started order from the selection circuit 120-1 to the selection circuit 120-6. Accordingly, the bits of the count signal output by the second switching unit 111 to the respective data lines C0 to C6 are the same as those illustrated in FIG. 2C. Accordingly, the bit numbers of the count signal output by the second switching unit 111 to the respective data lines C0 to C6 when the first switching unit 107 is operated in the configuration illustrated in FIG. 2A can be set to be identical to those when the first switching unit 107 is operated in the configuration illustrated in FIG. 2B. Accordingly, it is possible to avoid the switching of the operations in accordance with the presence or absence of a defect in the memory unit 104 in the circuit outside the image pickup apparatus.

In addition, since the image pickup apparatus according to the present exemplary embodiment includes the first switching unit 107, the circuit outside the image pickup apparatus to which the count signal is output from the second switching unit 111 can hold the count signal without the deficit of the bit even when the defect exists in the memory unit 104.

In this manner, the image pickup apparatus according to the present exemplary embodiment can change the bits of the count signal output by the first switching unit 107 to the data lines B0 to B5 in accordance with the defect in the bit memory in the memory unit 104. The first switching unit 107 changes the bits of the count signal commonly with respect to the plurality of memory units 104. Accordingly, it is possible to reduce the circuit area as compared with a case where the memory unit 104 in each of the plurality of AD conversion units is provided with a switching unit. In addition, even when the defect exists in the memory unit 104, since the first switching unit 107 changes the bits of the count signal output to the data lines B0 to B5, the memory unit 104 can hold the count signal.

Thus, the image pickup apparatus according to the present exemplary embodiment can provide the technology for suppressing the decrease in the image quality caused by the defect in the AD conversion unit while the increase in the circuit scale of the plurality of AD conversion units is suppressed.

It should be noted that, according to the present exemplary embodiment, the descriptions have been given of the case where the bit memory connected to the data line B3 has the defect, but the configuration can be applied to a case where any one of the bit memories connected to the data lines B0 to B5 has the defect.

In addition, according to the present exemplary embodiment, the data line BD is provided such that the signal of the bit [5] of the count signal is transmitted therethrough, but the configuration is not limited to the above. Next, another image pickup apparatus according to the present exemplary embodiment will be described.

Figure 3A:
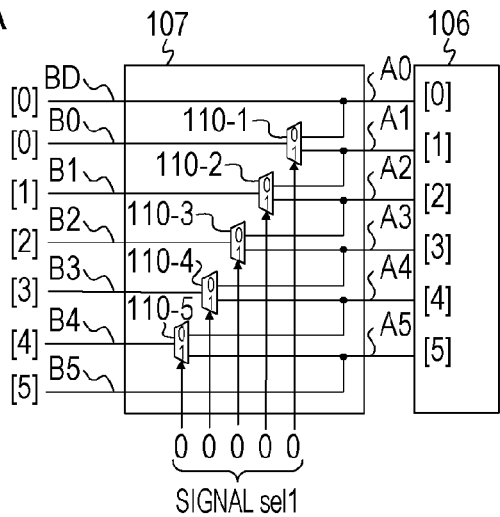
FIG. 3A illustrates the configurations and the operations of the first switching unit and the measurement counter.

FIG. 3A illustrates the configurations of the first switching unit 107 and the measurement counter 106 of another image pickup apparatus. In FIG. 3A too, the component having the same function as that in FIG. 2A is assigned with the same reference numeral as that assigned in FIG. 2A. In FIG. 2A, the redundant bit memory in the memory unit 104 on each column holds the signal of the bit [5] corresponding to the most significant bit. FIG. 3A illustrates an example in which the redundant bit memory in the memory unit 104 on each column holds the signal of the bit [0] corresponding to the least significant bit.

FIG. 3A illustrates an operation in a case where no defect exists in the bit memories. The signal value of the signal sel1 is (00000) in the order from the selection circuit 110-5 to the selection circuit 110-1.

FIG. 3A illustrates the first operation. The first operation mentioned herein is an operation in which the signal of the bit [1] corresponding to the first bit is held in the bit memory connected to the data line B1 corresponding to the first bit memory the plurality of bit memories. Subsequently, the signal of the bit [0] corresponding to the lower order bit with respect to the first bit by one bit is held in the bit memory connected to the data line B0 corresponding to the second bit memory among the plurality of bit memories.

Figure 3B:
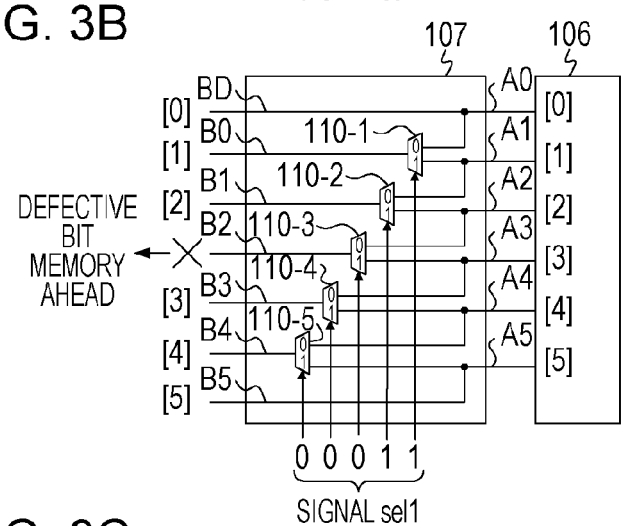
FIG. 3B illustrates the configurations and the operations of the first switching unit and the measurement counter.

FIG. 3B illustrates an operation in a case where the bit memory connected to the data line B2 has a defect in the configurations of the first switching unit 107 and the measurement counter 106 illustrated in FIG. 3A. The switching control unit 108 sets the signal value of the signal sel1 as (00011) in the order from the selection circuit 110-5 to the selection circuit 110-1. Accordingly, the signals of the bit [1] and the bit [2] of the count signal are respectively output to the data line B0 and the data line B1. In addition, the signals of the bits [3] to [5] of the count signal are respectively output to the data lines B3 to B5. The signal of the bit [0] of the count signal is output to the data line BD. That is, in contrast to the operation of FIG. 3A, in the operation of FIG. 3B, the signals of the bits lower than or equal to the bit [2] are shifted to the lower order by one bit each.

FIG. 3B illustrates the second operation. The second operation mentioned herein is an operation in which the signal of the bit [1] corresponding to the first bit is held in the bit memory connected to the data line B0 corresponding to the second bit memory among the plurality of bit memories. In addition, according to the present exemplary embodiment, as a part of the second operation, furthermore, the signal of the bit [0] corresponding to the lower order bit with respect to the signal of the bit [1] corresponding to the first bit by one bit is held in the redundant bit memory connected to the data line BD.

Figure 3C:
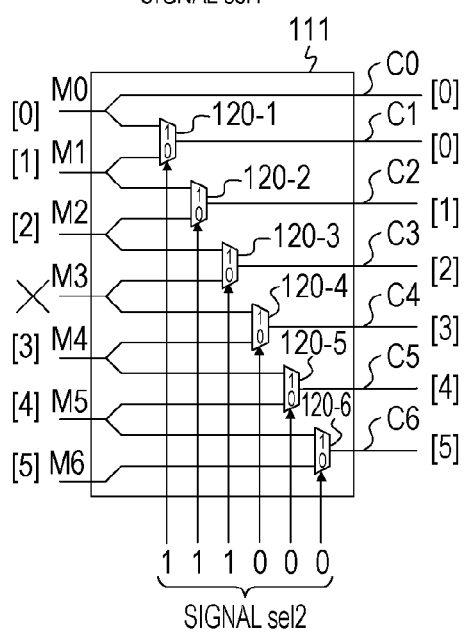
FIG. 3C illustrates the configuration and the operation of the second switching unit.

FIG. 3C illustrates the configuration of the second switching unit 111. In FIG. 3C too, the component having the same function as that in FIG. 2C is assigned with the same reference numeral as that assigned in FIG. 2C.

The switching control unit 108 sets the signal value of the signal sel2 as (111000) in the stated in the stated order from the selection circuit 120-1 to the selection circuit 120-6. On the other hand, in a case where the first switching unit 107 performs the operation of FIG. 3A, the switching control unit 108 sets the signal value of the signal sel2 as (000000) in the stated in the stated order from the selection circuit 120-1 to the selection circuit 120-6.

Accordingly, the bit numbers output to the data lines C0 to C6 when the first switching unit 107 is operated in the configuration of FIG. 3A are identical to those when the first switching unit 107 is operated in the configuration of FIG. 3B.

In this manner, the operation can be appropriately executed in a case where the redundant bit memory in the memory unit 104 on each column holds either the most significant bit of the count signal or the least significant bit. The redundant bit memory in the memory unit 104 on each column does not need to hold the signal of the most significant bit or the least significant bit of the count signal and may hold a signal of one of the bits of the count signal.

In addition, one AD conversion unit is provided with respect to the pixels 10 on one column according to the present exemplary embodiment, but other arrangements may be adopted. For example, one AD conversion unit is provided to be commonly shared by the pixels 10 on two columns, or two AD conversion units may be provided with respect to the pixels 10 on one column.

It should be noted that, according to the present exemplary embodiment, in a case where no defect exists in the bit memory in the memory unit 104 too, the first switching unit 107 outputs the count signal to the data line BD as in FIG. 2A or FIG. 3A. As another example, in a case where no defect exists in the bit memory in the memory unit 104, it may be sufficient if the first switching unit 107 does not output the count signal to the data line BD.

It should be noted that, according to the present exemplary embodiment, the count signal is the 6-bit signal, but it is sufficient if the count signal is a 2-bit signal or above.

Second Exemplary Embodiment

With regard to the image pickup apparatus according to the present exemplary embodiment, a configuration different from that of the first exemplary embodiment will be mainly described.

The configuration of the image pickup apparatus according to the present exemplary embodiment is the same as that illustrated in FIG. 1. However, two redundant bit memories are provided to the memory unit 104 on each column according to the present exemplary embodiment.

Figure 4A:
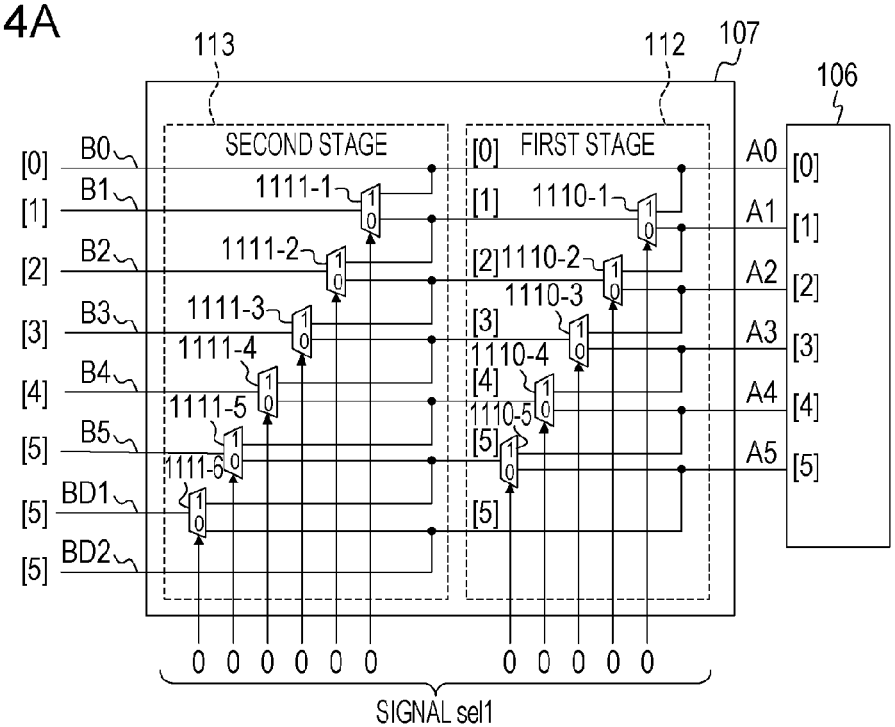
FIG. 4A illustrates the configurations and the operations of the first switching unit and the measurement counter.

FIG. 4A illustrates the configuration of the first switching unit 107 according to the present exemplary embodiment. In FIG. 4A too, the component having the same function as that in FIG. 2A is assigned with the same reference numeral as that assigned in FIG. 2A. The first switching unit 107 according to the present exemplary embodiment includes a selection stage 112 in the first stage including selection circuits 1110-1 to 1110-5 and a selection stage 113 in the second stage including selection circuits 1111-1 to 1111-6. The signal sel1 output from the switching control unit 108 is an 11-bit signal.

The measurement counter 106 outputs a 6-bit count signal to the respective data lines A0 to A5. The selection stage 112 in the first stage and the selection stage 113 in the second stage respectively output the signals of the respective bits of the count signal to the data lines B0 to B5, the data line BD 1, and the data line BD 2 in accordance with the signal value of the signal sel1. In a case where all the signals input to the respective selection circuits of the signal sel1 are 0 as in FIG. 4A, the signals of the bits [0] to [5] of the count signal are output to the data lines B0 to B5 in the stated order. The signal of the bit [5] of the count signal is output to both the data line BD 1 and the data line BD 2.

FIG. 4A illustrates the first operation. In the first operation mentioned herein, the signal of the bit [4] corresponding to the signal of the first bit is held in the bit memory connected to the data line B4 corresponding to the first bit memory. Subsequently, the signal of the bit [5] corresponding to the second bit that is the higher order bit with respect to the first bit by one bit is held in the bit memory connected to the data line B5.

Figure 4B:
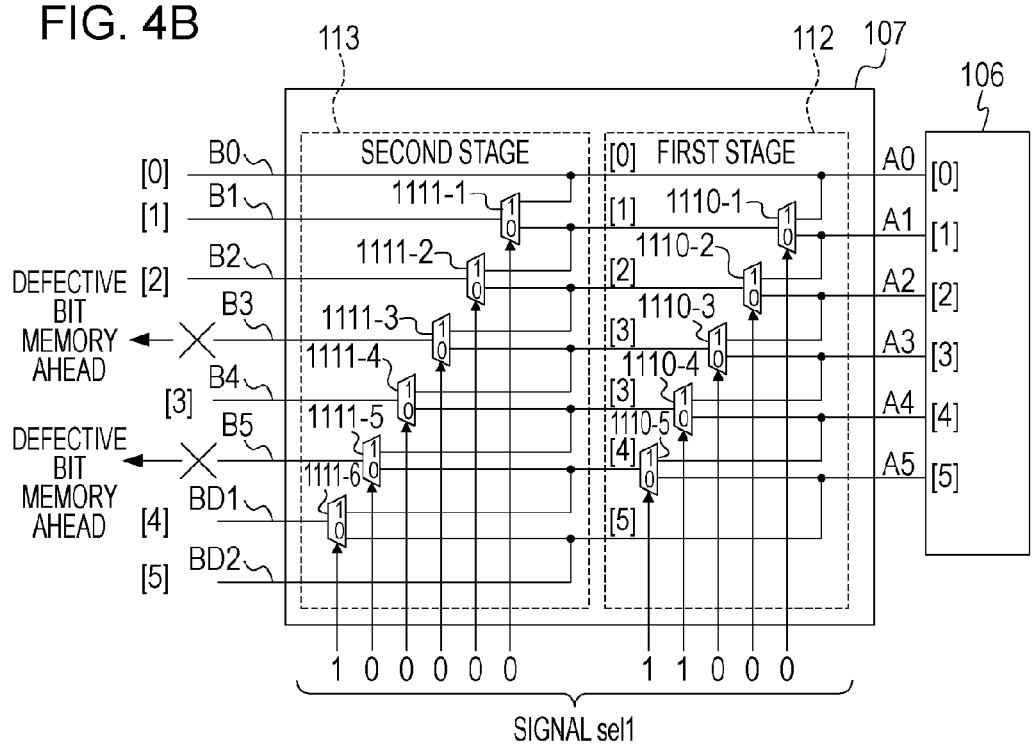
FIG. 4B illustrates the configurations and the operations of the first switching unit and the measurement counter.

Next, the operation of the first switching unit 107 will be described with reference to FIG. 4B. FIG. 4B illustrates the operation in a case where defects are detected in the bit memories connected to the data line B3 and the data line B5 in the plurality of memory units 104. The case where the defects are detected in the bit memories connected to the data line B3 and the data line B5 refers, for example, to a case where the bit memory connected to the data line B3 has the defect in a certain memory unit 104, and the bit memory connected to the data line B5 in a different memory unit 104 has the defect. In addition, as another example, the operation can be applied to a case where both the bit memories connected to the data line B3 and the bit memory connected to the data line B5 in one memory unit 104 have the defect.

FIG. 4B illustrates the second operation. The second operation mentioned herein is an operation in which the signal of the bit [4] corresponding to the signal of the first bit is held in the redundant bit memory connected to the data line BD 1, and the signal of the bit [5] corresponding to the signal of the second bit is held in the redundant bit memory connected to the data line BD 2.

The switching control unit 108 sets a signal value of the bits output to the selection circuit 1111-6, the selection circuit 1110-5, and the selection circuit 1110-4 as 1 and a signal value of the bits output to the other selection circuits as 0 for the signal sel1. Accordingly, the signals of the bits [0] to [2] of the count signal are respectively output to the data lines B0 to B2. The signal of the bit [3] of the count signal is output to the data line B4. The signals of the bits [4] and [5] of the count signal are respectively output to the data line BD 1 and the data line BD 2.

In this manner, the count signal can be held in the memory unit 104 on each column in the image pickup apparatus according to the present exemplary embodiment even in a case the defects exist in the respective bit memories in the mutually different memory units, that is, a case where the defects exist in the plurality of bit memories connected to the mutually different data lines.

Figure 5:
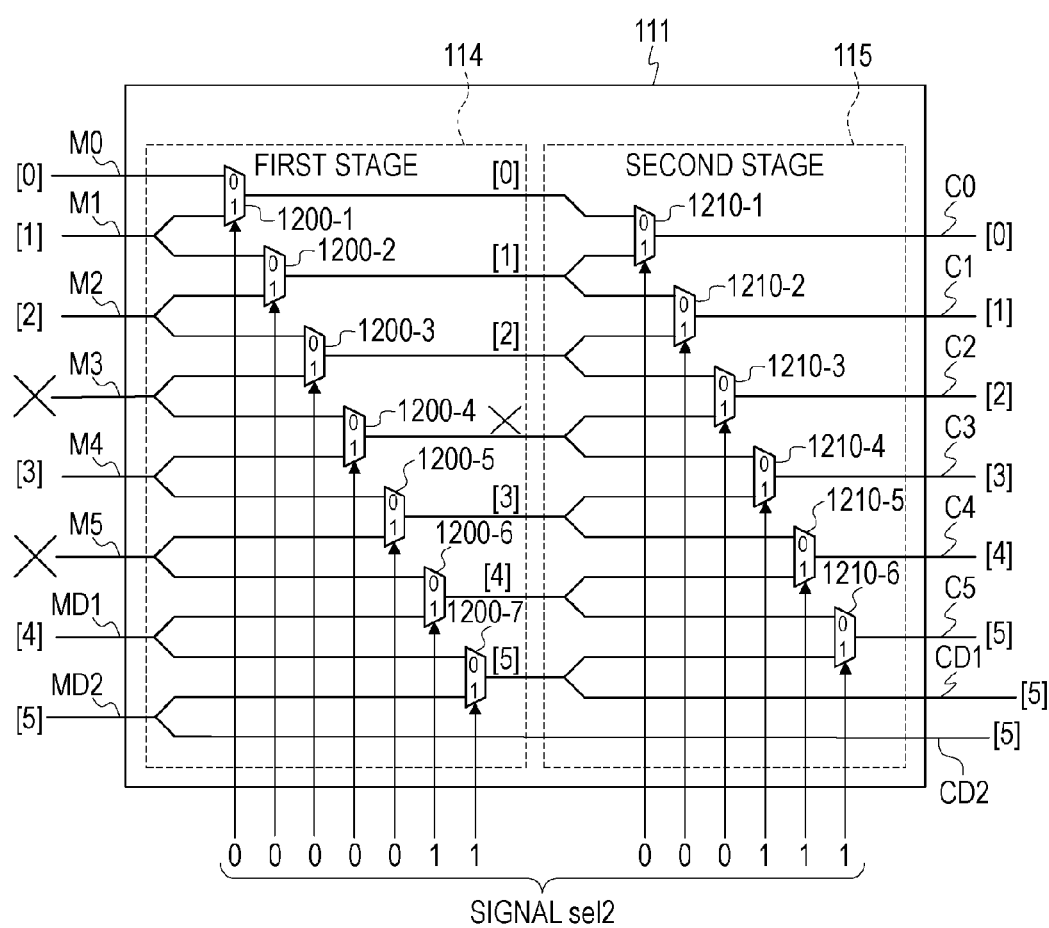
FIG. 5 illustrates the configuration and the operation of the second switching unit.

FIG. 5 illustrates the configuration and the operation of the second switching unit 111 according to the present exemplary embodiment. In FIG. 5 too, the component having the same function as that in FIG. 2C is assigned with the same reference numeral as that assigned in FIG. 2C. FIG. 5 illustrates an operation in a case where the first switching unit 107 performs the operation of FIG. 4B. The second switching unit 111 includes a selection stage 114 in the first stage including selection circuits 1200-1 to 1200-7 and a selection stage 115 in the second stage including selection circuits 1210-1 to 1210-6. The signal sel2 output by the switching control unit 108 is a 13-bit signal. The switching control unit 108 sets the signal value of the bits output to the selection circuit 1200-6, the selection circuit 1200-7, the selection circuit 1210-4, the selection circuit 1210-5, and the selection circuit 1210-6 as 1 and the signal value of the bits output to the other selection circuits as 0 for the signal sel2. Although not illustrated in the drawing, in a case where the first switching unit 107 performs the operation of FIG. 4A, the switching control unit 108 sets the signal value of all the bits of the signal sel2 as 0. Accordingly, the bit numbers of the count signal output to the data lines C0 to C5 can be respectively identical to each other in a case where the first switching unit 107 performs either the operation of FIG. 4A or the operation of FIG. 4B. Accordingly, the image pickup apparatus according to the present exemplary embodiment can attain the same effect as the effect described according to the first exemplary embodiment. Furthermore, even in a case where defects are detected in the plurality of bit memories in the plurality of memory units 104, the image pickup apparatus according to the present exemplary embodiment can hold the count signal in the memory unit 104 on each column without the deficit of the bits.

It should be noted that, according to the present exemplary embodiment, the example has been illustrated in which the redundant bit memory holds the signal of the bit [5], but the redundant bit memory may hold a different bit of the count signal.

For instance, an example in which the redundant bit memory holds the signal of the bit [0] will be described.

Figure 6A:
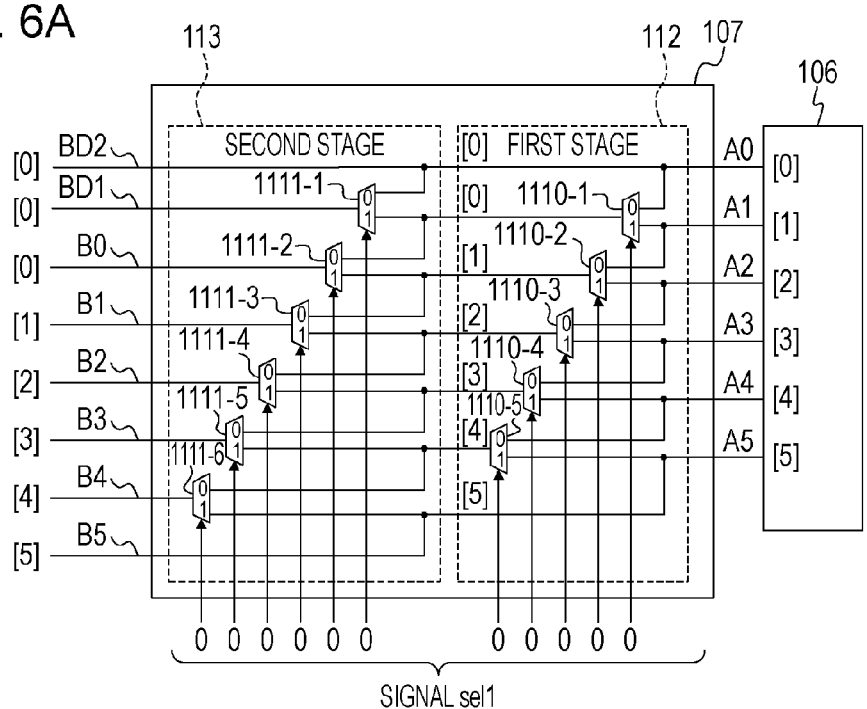
FIG. 6A illustrates the configurations and the operations of the first switching unit and the measurement counter.

FIG. 6A illustrates the operation performed by the first switching unit 107 to output the signal of the bit [0] to the data line BD 1 and the data line BD 2.

FIG. 6A illustrates the first operation. In the first operation mentioned herein, the signal of the bit [0] corresponding to the signal of the first bit is held in the bit memory connected to the data line B0 corresponding to the first bit memory. Subsequently, the signal of the bit [1] corresponding to the second bit that is the higher order bit with respect to the first bit by one bit is held by the bit memory connected to the data line B1.

Figure 6B:
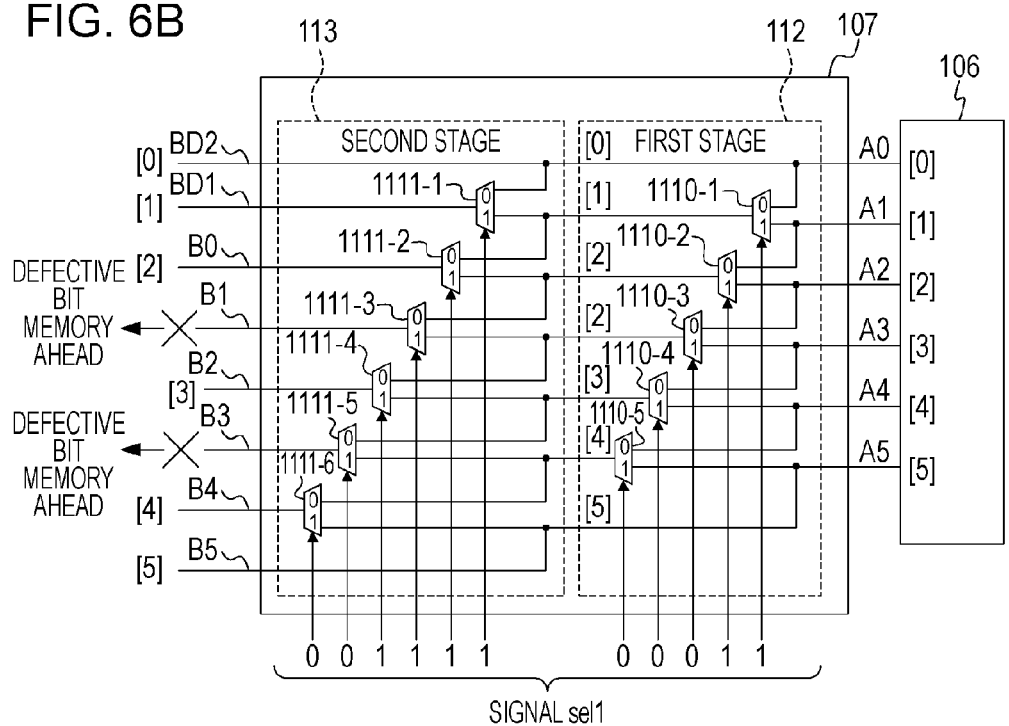
FIG. 6B illustrates the configurations and the operations of the first switching unit and the measurement counter.

FIG. 6B illustrates an operation in a case where defects are detected in the bit memories connected to the data line B1 and the data line B3. The switching control unit 108 sets the signal value of the respective bits of the signal sel1 output to the selection circuits 1111-4, 1111-3, 1111-2, 1111-1, 1110-2, and 1110-1 as 1 and the signal value of the respective bits of the signal sel1 output to the other selection circuits as 0. Accordingly, the first switching unit 107 outputs the signal of the bit [0] to the data line BD 2 and outputs the signal of the bit [1] to the data line BD 1. In addition, the first switching unit 107 outputs the signal of the bit [2] to the data line B0 and outputs the signal of the bit [3] to the data line B2. Moreover, the first switching unit 107 outputs the signal of the bit [4] to the data line B4 and outputs the signal of the bit [5] to the data line B5.

FIG. 6B illustrates the second operation. The second operation mentioned herein is an operation in which the signal of the bit [0] corresponding to the signal of the first bit is held in the redundant bit memory connected to the data line BD 2, and the signal of the bit [1] corresponding to the signal of the first bit is held in the redundant bit memory connected to the data line BD 1.

Figure 7:
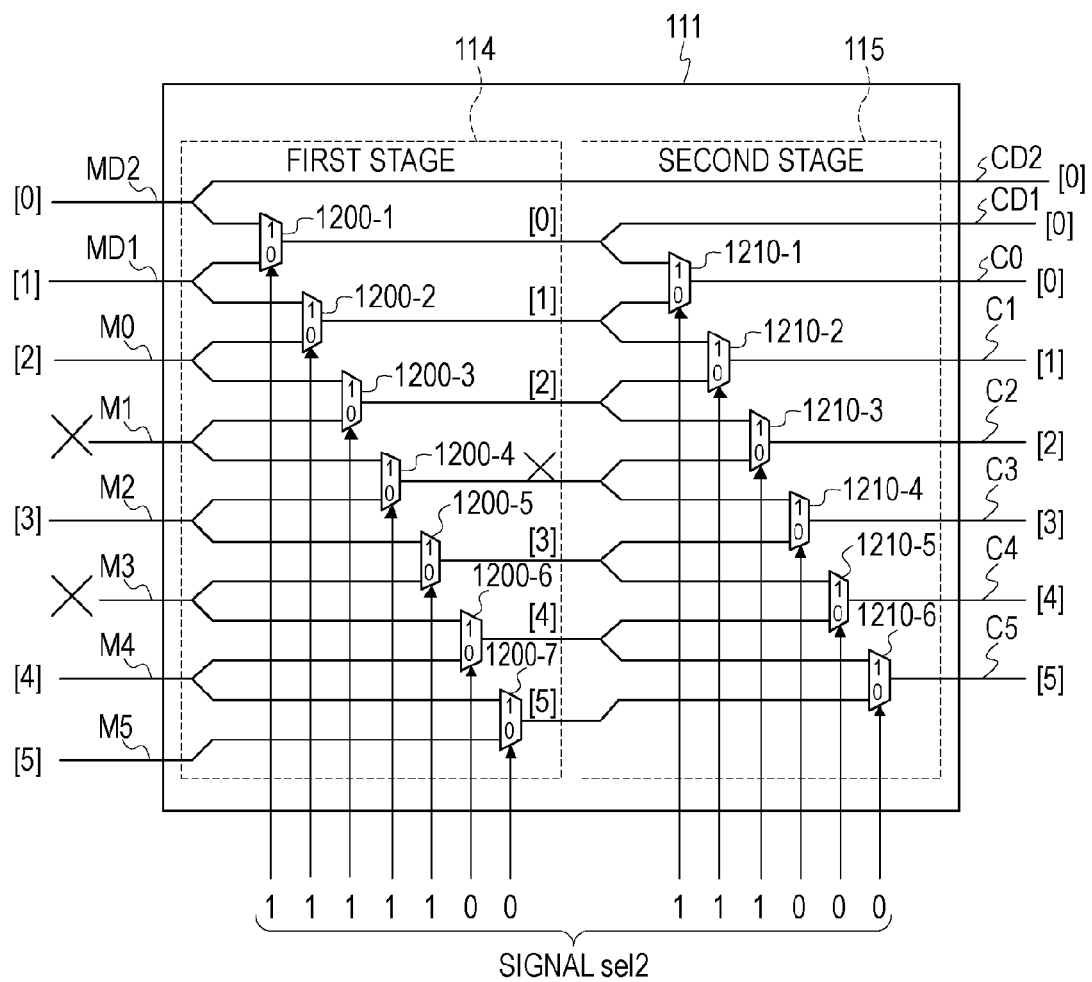
FIG. 7 illustrates the configuration and the operation of the second switching unit.

FIG. 7 illustrates the operation of the second switching unit 111 in a case where the first switching unit 107 performs the operation of FIG. 6B. With regard to the signal sel2, the switching control unit 108 sets the signal values of the respective bits of the signal sel2 output to the selection circuits 1200-1, 1200-2, 1200-3, 1200-4, 1200-5, 1210-1, 1210-2, and 1210-3 as 1 and sets the signal values of the bits output to the other selection circuits as 0. On the other hand, in a case where the first switching unit 107 performs the operation illustrated in FIG. 6A, the switching control unit 108 sets the signal values of all the bits the signal sel2 as 0. Accordingly, the bit numbers of the count signal output to the data lines C0 to C5 can be respectively identical to each other in a case where the first switching unit 107 performs either the operation of FIG. 6A or the operation of FIG. 6B. Accordingly, the image pickup apparatus that has the configuration and performs the operation which are illustrated in FIG. 6A, FIG. 6B, and FIG. 7 can attain the same effect as that of the image pickup apparatus that has the configuration and performs the operation which are illustrated in FIG. 4A, FIG. 4B, and FIG. 5.

Third Exemplary Embodiment

With regard to the image pickup apparatus according to the present exemplary embodiment, a configuration different from that of the first exemplary embodiment will be mainly described.

The configuration of the image pickup apparatus according to the present exemplary embodiment is the same as the configuration of the image pickup apparatus illustrated in FIG. 1. However, the memory unit 104 on each column does not include the redundant bit memory. In a case where a defect is detected in a bit memory that holds a signal of a bit other than the least significant bit, the image pickup apparatus according to the present exemplary embodiment holds the signal of the bits other than the least significant bit in the memory unit 104 on each column. This is a particularly effective operation in a case, for example, where the signal value of the least significant bit does not affect the quality of the image formed by using the signals output by the image pickup apparatus. The above-described case includes, for example, a scene for imaging an object having a high luminance.

Figure 8A:
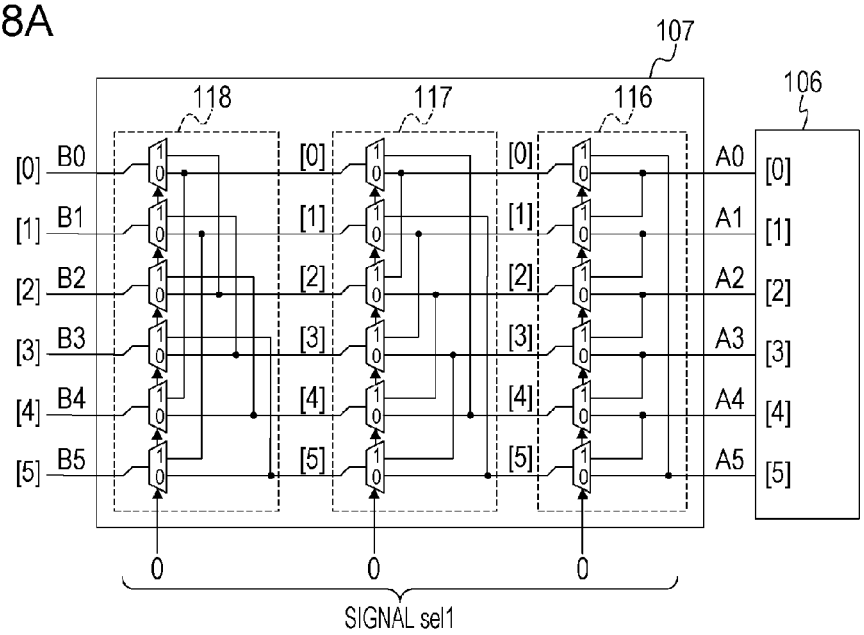
FIG. 8A illustrates the configurations and the operations of the first switching unit and the measurement counter.

FIG. 8A illustrates the configurations and the operations of the measurement counter 106 and the first switching unit 107 according to the present exemplary embodiment. In FIG. 8A too, the component having the same function as that in FIG. 2A is assigned with the same reference numeral as that assigned in FIG. 2A. The first switching unit 107 according to the present exemplary embodiment includes a selection stage 116, a selection stage 117, and a selection stage 118 each including selection circuits. The common signal sel1 is input to the selection circuits of the selection stage 116. Similarly as in the selection stage 116, with regard to the selection stage 117 and the selection stage 118 too, the common signal sel1 is input to the selection circuits.

The signal sel1 according to the present exemplary embodiment is a 3-bit signal. In the operation illustrated in FIG. 8A, the switching control unit 108 sets all the signal values of the respective bits of the signal sel1 as 0. The first switching unit 107 sequentially outputs the signals of the bits [0] to [5] to the respective data lines B0 to B5.

Figure 8B:
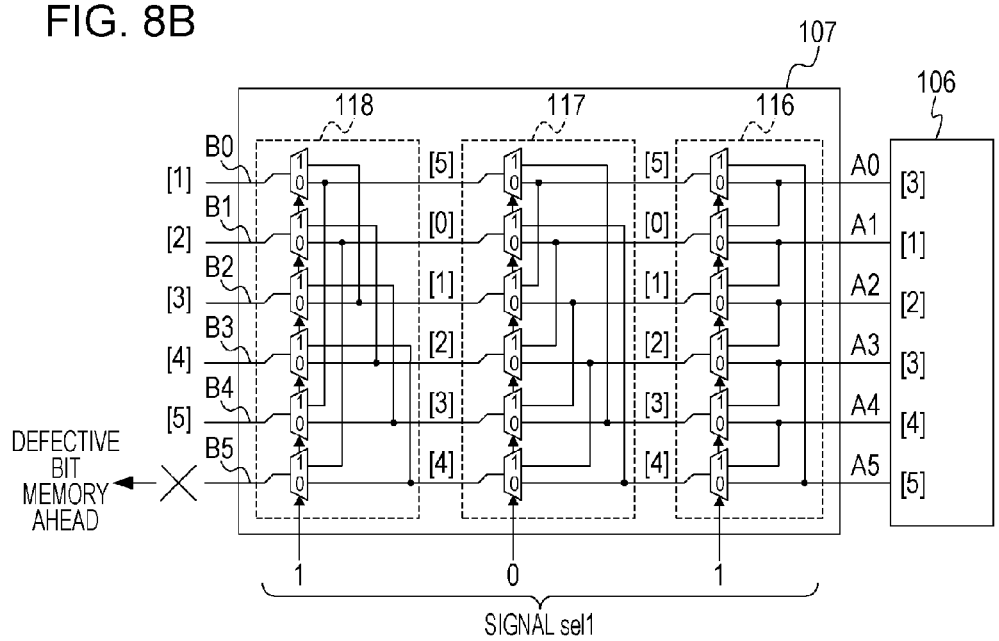
FIG. 8B illustrates the configurations and the operations of the first switching unit and the measurement counter.

FIG. 8B illustrates the operation in a case where the defect in the bit memory connected to the data line B5 in the memory unit 104 is detected. The switching control unit 108 sets the signal values of the respective bits of the signal sel1 output to the selection stage 116 and the selection stage 118 as 1 and sets the signal value of the bit of the signal sel1 output to the selection stage 117 as 0. Accordingly, the signals of the bits [1] to [5] are sequentially respectively output to the data lines B0 to B4. The count signal is not output to the data line B5.

Figure 9:
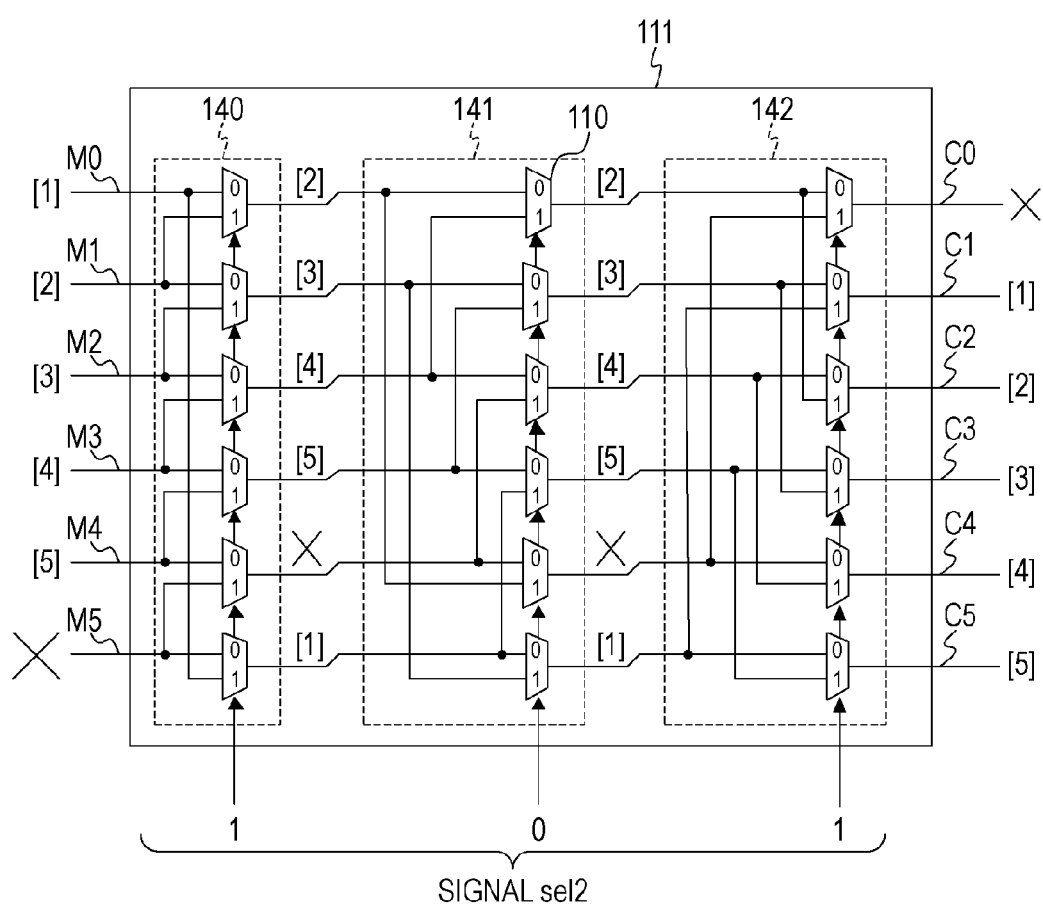
FIG. 9 illustrates the configuration and the operation of the second switching unit.

FIG. 9 illustrates the configuration and the operation of the second switching unit 111. The second switching unit 111 includes a selection stage 140, a selection stage 141, and a selection stage 142 each of which includes selection circuits. The signal sel2 is input to the selection stage 140, the selection stage 141, and the selection stage 142. The common signal sel2 is input to the selection circuits in the selection stage 140. The common signal sel2 is similarly input to the selection circuits respectively in the selection stage 141 and the selection stage 142.

The signal sel2 according to the present exemplary embodiment is a 3-bit signal. In the operation of the second switching unit 111 illustrated in FIG. 9, the switching control unit 108 sets the signal values of the bits of the signal sel2 output to the selection stage 140 and the selection stage 142 as 1 and sets the signal value of the bit of the signal sel2 output to the selection stage 141 as 0. Accordingly, the count signal is not output to the data line C0, and the signals of the bits [1] to [5] are sequentially respectively output to the data lines C1 to C5.

Although not illustrated in the drawing, in a case where the first switching unit 107 performs the operation of FIG. 8A, the switching control unit 108 sets all the signal values of the respective bits of the signal sel2 as 0. Accordingly, the signals of the bits [0] to [5] are sequentially respectively output to the data lines C0 to C5. Therefore, the bit numbers of the count signal respectively output to the data lines C1 to C5 except for the data line C0 can be respectively identical to each other in a case where the first switching unit 107 performs either the operation of FIG. 8A or the operation of FIG. 8B.

In the image pickup apparatus according to the present exemplary embodiment, in a case where the memory unit 104 does not include the redundant bit memory, it is possible to suppress the decrease in the image quality caused by the defect in the AD conversion unit while the increase in the circuit scale of the plurality of AD conversion units is suppressed. The image pickup apparatus according to the present exemplary embodiment is particularly effective to a configuration in which reduction of the circuit area is demanded, and the memory unit 104 is not provided with the redundant bit memory.

According to the present exemplary embodiment, the descriptions have been given of the example in which the signal of the bit [0] corresponding to the least significant bit is not output by the first switching unit 107 in a case where the defect is detected in the bit memory in the memory unit 104, but a configuration in which the signal of the most significant bit is not output may be adopted. In this case, it is particularly effective for imaging an object having a low luminance. In addition, a configuration may be adopted that the first switching unit 107 does not output the signals of the bits other than the least significant bit and the most significant bit.

It should be noted that the concept in which the first switching unit 107 according to the present exemplary embodiment does not output a signal of one of the bits of the count signal may be applied to the image pickup apparatus according to the first exemplary embodiment. For example, the first switching unit 107 does not output the signal of the bit [0], and the first switching unit 107 may hold the count signal by using the redundant bit memory. In this case, the image pickup apparatus according to the first exemplary embodiment can suppress the decrease in the image quality caused by the defects in the AD conversion unit with respect to the defects in the bit memories of the two bits while the increase in the circuit scale of the plurality of AD conversion units is suppressed.

Fourth Exemplary Embodiment

With regard to the image pickup apparatus according to the present exemplary embodiment, a configuration different from that of the first exemplary embodiment will be mainly described.

Figure 10:
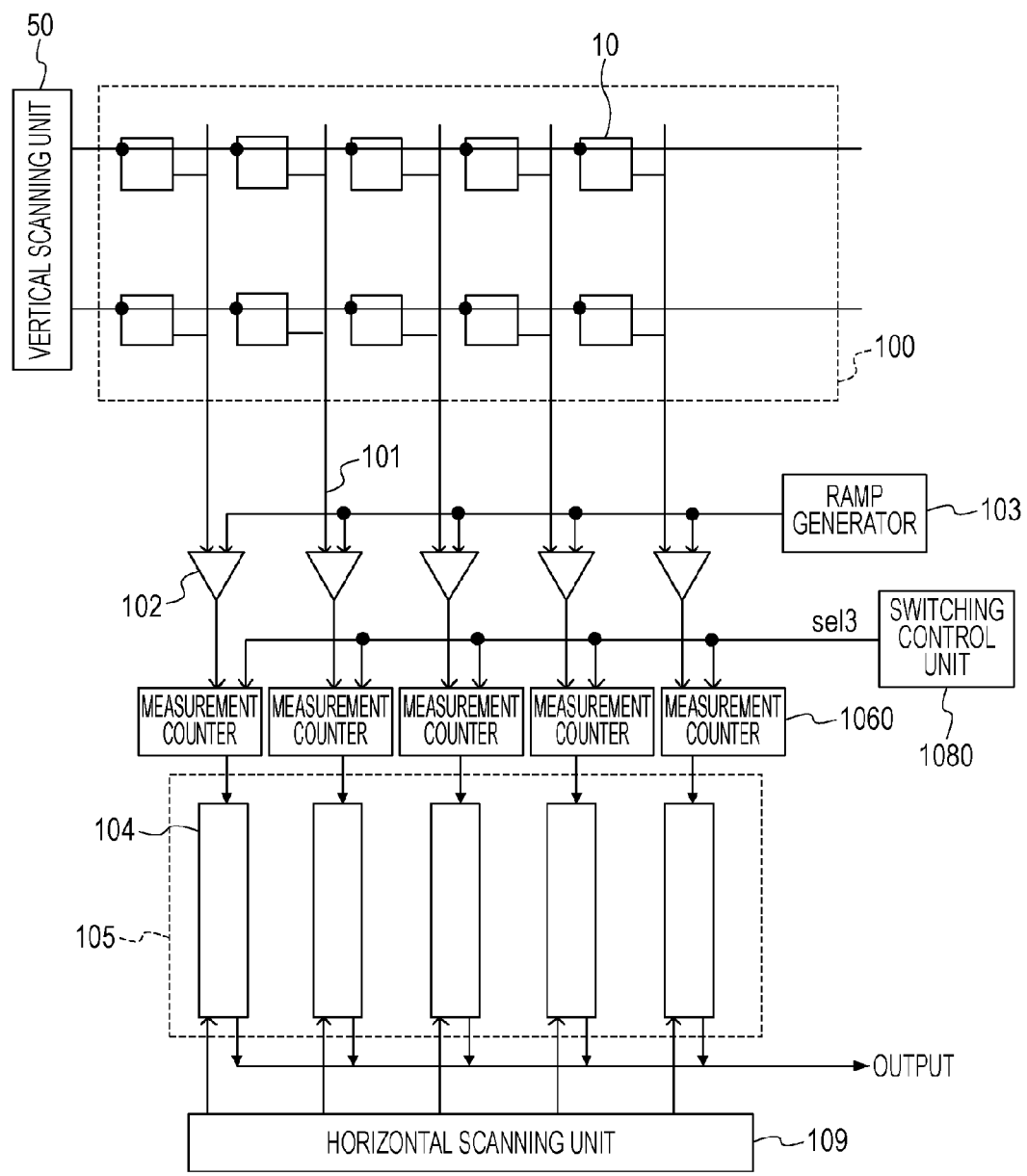
FIG. 10 illustrates an example configuration of the image pickup apparatus.

FIG. 10 illustrates the configuration of the image pickup apparatus according to the present exemplary embodiment. In FIG. 10 too, the component having the same function as that in FIG. 1 is assigned with the same reference numeral as that assigned in FIG. 1.

The image pickup apparatus according to the present exemplary embodiment is provided with measurement counters 1060 on the respective columns. The measurement counter 1060 on each of the columns stops the counting of the number of clocks at the timing at which the signal value of the comparison result signal output from the comparator 102 is changed and holds the count signal at the time point. This count signal is a digital signal based on the photoelectric conversion signal. The memory unit 104 holds the count signal held by the measurement counter 1060. A switching control unit 1080 outputs a signal sel3 to the measurement counters 1060 on the respective columns. Each of the AD converters on the respective columns according to the present exemplary embodiment includes the measurement counter 1060.

Figure 11A:
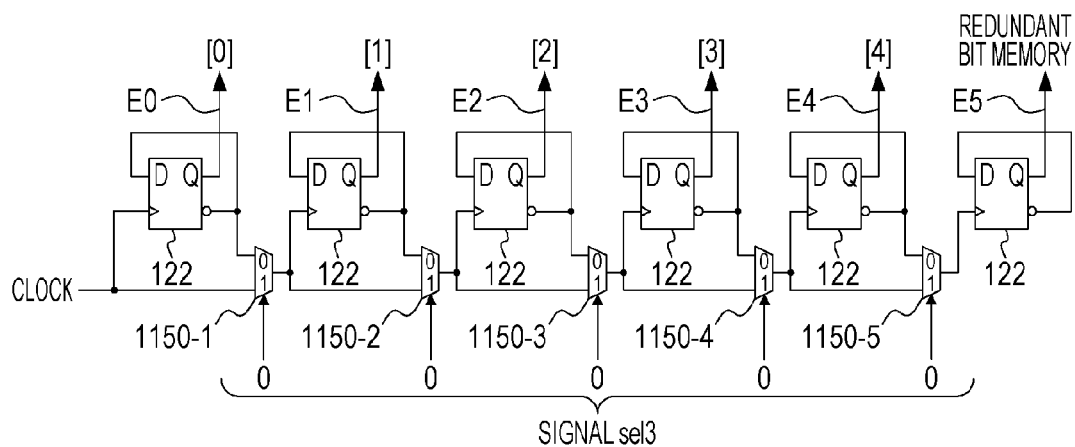
FIG. 11A illustrates an example configuration and an example operation of the measurement counter.

FIG. 11A illustrates a configuration and an operation of the measurement counter 1060. The measurement counter 1060 includes six flip-flop circuits 122 and five selection circuits 1150. The measurement counter 1060 is an asynchronous counter that uses an inverted output that is output from the flip-flop circuit 122 as a clock signal of the flip-flop circuit 122 in the next stage. The measurement counter 1060 generates a 5-bit count signal. The selection circuit 1150 outputs the clock signal or the output of the flip-flop circuit 122 to the flip-flop circuit 122 in the next stage. The flip-flop circuits 122 are respectively connected to the corresponding bit memories in the memory unit 104 and the redundant bit memory via data lines E0 to E5. The switching control unit 1080 sets all the signal values of the respective bits of the signal sel3 as 0. Accordingly, the flip-flop circuits 122 sequentially respectively output the signals of the bits [0] to [4] to the data lines E0 to E4. A signal obtained by performing frequency dividing of the signal of the bit [4] is input to the redundant bit memory. As another example, a power supply of the flip-flop circuit 122 connected to the data line E5 may be turned off to reduce power consumption of the measurement counter 1060.

Figure 11B:
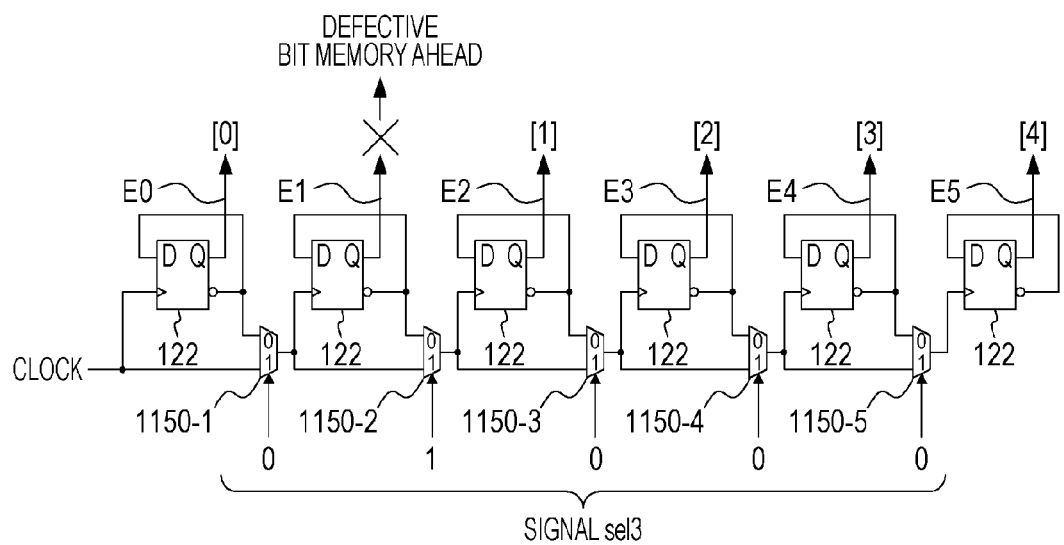
FIG. 11B illustrates an example configuration and an example operation of the measurement counter.

FIG. 11B illustrates an operation in a case where a defect is detected in the bit memory connected to the data line E1. The switching control unit 1080 sets the signal value of the bit of the signal sel3 output to the selection circuit 1150-2 as 1 and sets all the signal values of the bits of the signal sel3 output to the other selection circuits 1150 as 0. Accordingly, the signal of the bit [0] is output to the data line E0. In addition, the signals of the bits [1] to [4] are sequentially respectively output to the data lines E2 to E5.

In this manner, according to the present exemplary embodiment too, it is possible to attain the same effect as the effect of the image pickup apparatus according to the first exemplary embodiment.

It should be noted that the image pickup apparatus according to the present exemplary embodiment may be further provided with a second switching unit configured to change the order of the bits of the count signal output from the memory unit 104 on each column similarly as in the other exemplary embodiments.

Figure 12A:
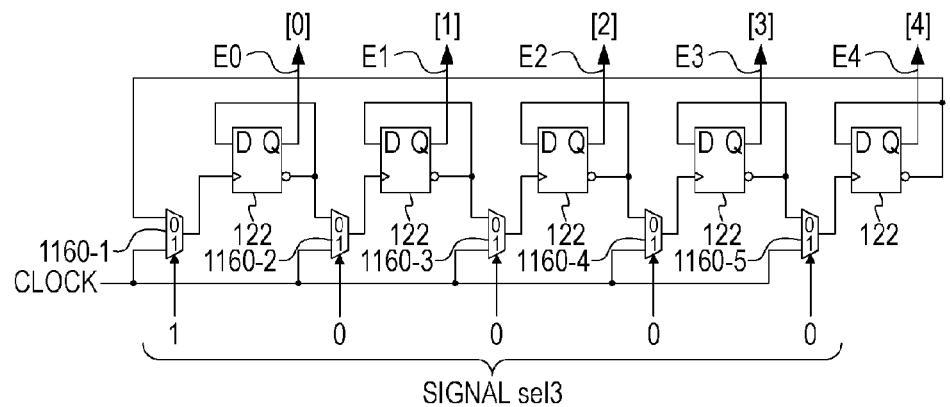
FIG. 12A illustrates an example configuration and an example operation of the measurement counter.

The descriptions have been given of the case where the image pickup apparatus according to the present exemplary embodiment has the configuration in which the memory unit 104 on each column has the redundant bit memory, but a configuration may also be adopted in which the memory unit 104 on each column does not include the redundant bit memory. In this case, as in FIG. 12A, a configuration is adopted in which the data line E5 and the flip-flop circuit 122 that outputs the count signal to the data line E5 are omitted with respect to FIG. 11A. In addition, according to the configuration, an inverted output of the flip-flop circuit 122 that outputs the count signal to the data line E4 is input to a selection circuit 1160-1.

Figure 12B:
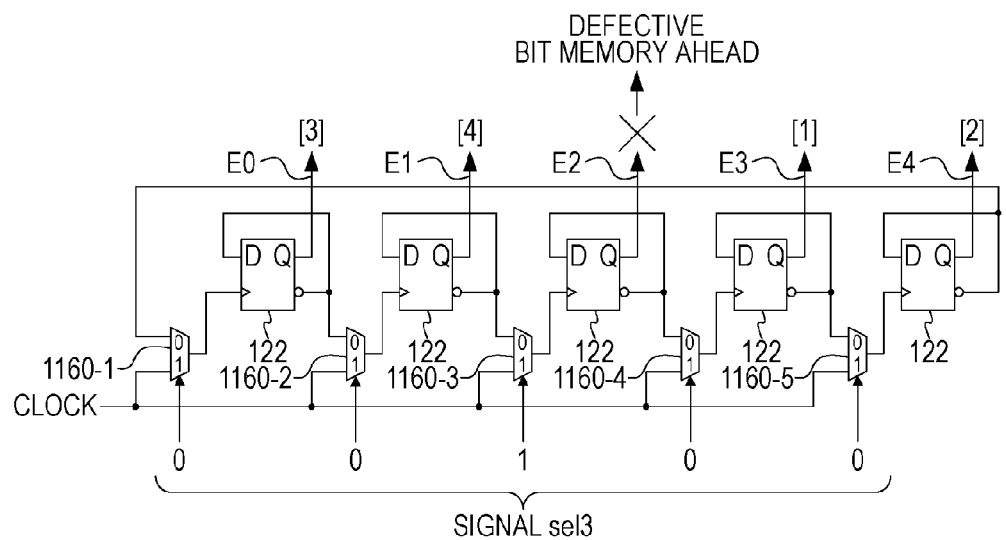
FIG. 12B illustrates an example configuration and an example operation of the measurement counter.

FIG. 12B illustrates an operation in a case where a defect is detected in the bit memory connected to the data line E2. The switching control unit 1080 sets the signal value of a bit of the signal sel3 output to a selection circuit 1160-3 as 1 and sets all the signal values of the other bits as 0. Accordingly, the signal of the bit [3] is output to the data line E0, and the signal of the bit [4] is output to the data line E1. In addition, the signal of the bit [1] is output to the data line E3, and the signal of the bit [2] is output to the data line E4. Therefore, similarly as in the image pickup apparatus according to the third exemplary embodiment, the count signal of the bits other than the bit [0] corresponding to the least significant bit is output to the memory unit 104.

It should be noted that FIGS. 11A and 11B illustrate the example in which the count signal other than the least significant bit is output to the memory unit 104, but a different bit may be set as the bit that is not output to the memory unit 104.

Fifth Exemplary Embodiment

With regard to the image pickup apparatus according to the present exemplary embodiment, a point different from the first exemplary embodiment will be mainly described. The image pickup apparatus according to the present exemplary embodiment includes a plurality of holding units. The image pickup apparatus according to the present exemplary embodiment has the configuration in which it is possible to suppress the decrease in the AD conversion accuracy while the increase in the circuit scale for the AD conversion units is suppressed even in a case where defects are detected in bit memories that hold different bits of the count signal in the plurality of holding units on the respective columns.

FIG. 13 illustrates the configuration of the image pickup apparatus according to the present exemplary embodiment. In FIG. 13 too, the component having the same function as that in FIG. 1 is assigned with the same reference numeral as that assigned in FIG. 1.

In the image pickup apparatus according to the present exemplary embodiment, pixel signals are output from the respective pixels 10. A pixel signal 1 is output from the pixels 10 on the first column. Similarly, pixel signals 2 to 4 are respectively output from the pixels 10 on the second to fourth columns in the stated order.

The image pickup apparatus according to the present exemplary embodiment includes a plurality of holding units on the respective columns as a holding unit 123 and a holding unit 124. A switching control unit 1082 outputs a signal sel4 to a first switching unit 1071. The measurement counter 106 outputs a count signal cnt to the first switching unit 1071. The first switching unit 1071 outputs a signal selout obtained by processing the count signal cnt to the holding unit 123 and the holding unit 124 on the basis of a signal value of the signal sel4 from the switching control unit 1082. The ramp generator 103 outputs a ramp signal rmp to the plurality of comparators 102. The plurality of comparators 102 respectively output comparison result signals comp1 to comp4 to each of the holding unit 123 and the holding unit 124.

The image pickup apparatus according to the present exemplary embodiment also includes a selection control unit 125. The selection control unit 125 outputs a signal msela to the holding unit 123 and outputs a signal mselb to the holding unit 124. When the selection control unit 125 sets the signal msela to be active, the memory unit 104 of the holding unit 123 can hold the count signal. On the other hand, when the selection control unit 125 sets the signal mselb to be active, the memory unit 104 of the holding unit 124 can hold the count signal. The holding unit 123 holds the count signal obtained by performing AD conversion of a noise signal. The holding unit 124 holds the count signal obtained by performing AD conversion of the photoelectric conversion signal.

Figure 14:
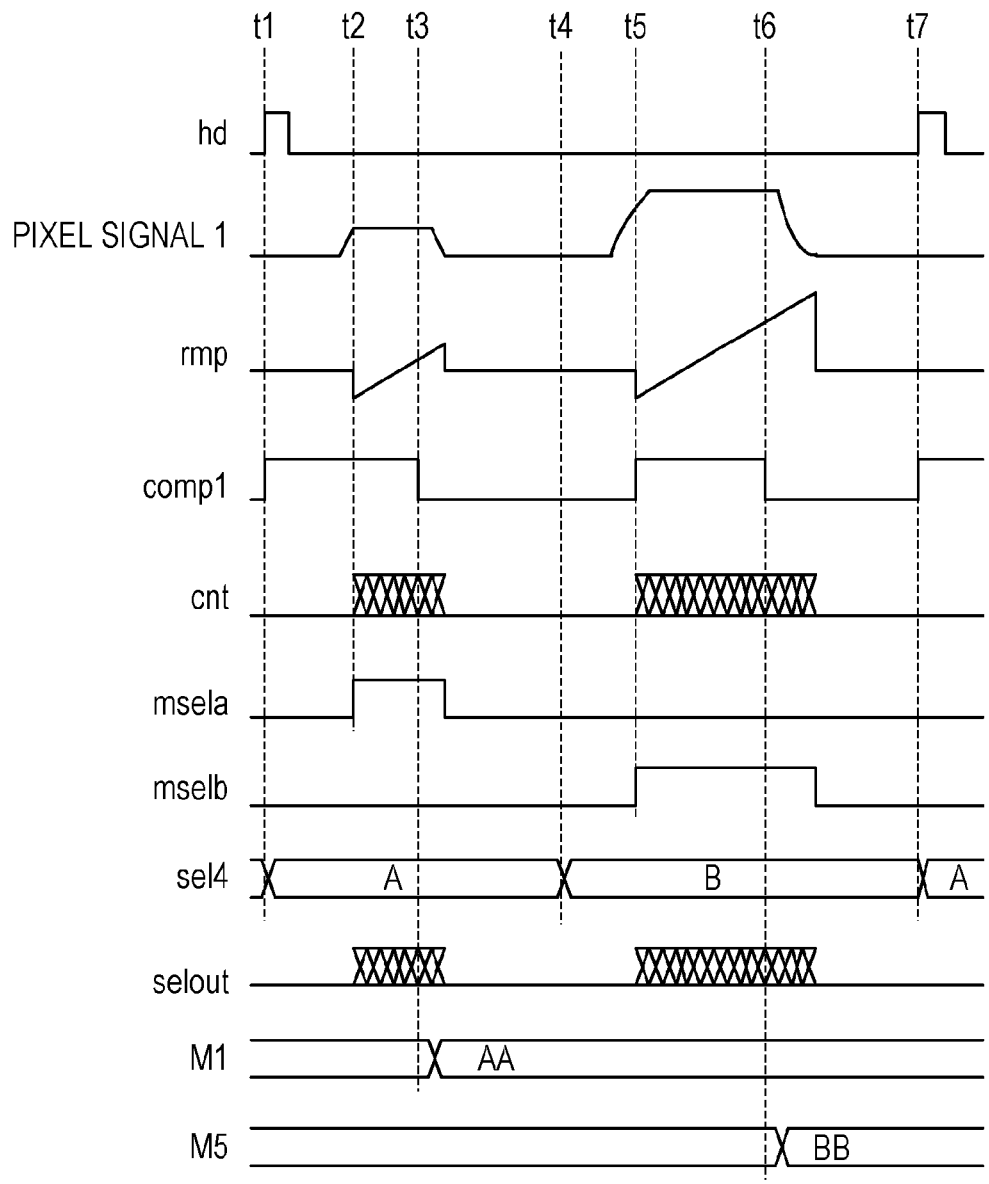
FIG. 14 illustrates an example operation of the image pickup apparatus.

FIG. 14 is a timing chart illustrating the operation of the image pickup apparatus illustrated in FIG. 13.

"hd" illustrated in FIG. 14 represents a horizontal synchronous signal. A period from a time t1 to a time t7 is one horizontal period. Pixel signal 1 represents an analog signal that is input to the comparator 102 from the pixel 10. Reference symbols of the respective signals illustrated in FIG. 14 correspond to the reference symbols of the respective signals illustrated in FIG. 13. FIG. 14 also illustrates operations related to the pixels 10 on one column which output the pixel signal 1.

At the time t1, the switching control unit 1082 sets the signal sel4 to have a signal value A corresponding to a defect in the bit memory of the holding unit 123 similarly as in the image pickup apparatus according to the first exemplary embodiment.

Then, at the time t2, the selection control unit 125 sets the signal msela to be active. At the time t2, the noise signal is output from the pixels 10 by the scanning of the vertical scanning unit 50.

A memory unit M1 corresponding to the memory unit 104 of the holding unit 123 provided so as to correspond to the pixels 10 on the first column holds a signal value AA corresponding to the count signal at a timing when a signal value of a comparison result signal comp1 is changed at the time t3. The count signal having the signal value AA is a digital signal based on the noise signal.

Thereafter, at the time t4, the switching control unit 1082 sets the signal sel4 to have a signal value B corresponding to a defect in the bit memory of the holding unit 124. According to the present exemplary embodiment, the signal value B is a value different from the signal value A.

At the time t5, the selection control unit 125 sets the signal mselb to be active. In addition, at the time t5, the photoelectric conversion signal is output from the pixels 10 by the scanning of the vertical scanning unit 50.

A memory unit M5 corresponding to the memory unit 104 of the holding unit 124 provided so as to correspond to the pixels 10 on the first column holds the signal value BB corresponding to the count signal at a timing when the signal value of the comparison result signal comp1 is changed at the time t6. The count signal having the signal value BB is a digital signal based on the photoelectric conversion signal.

In this manner, even in a case where defects are detected in the bit memories that holds different bits of the count signal by the plurality of holding units by switching the signal value of the signal sel4, the count signal can be held by each of the holding units.

It should be noted that the image pickup apparatus according to the present exemplary embodiment may be combined with the configurations and the operations of the image pickup apparatus according to the second to fourth exemplary embodiments. For example, as described in the second exemplary embodiment, each of the memory units 104 may include a plurality of redundant bit memories. In addition, as described in the third exemplary embodiment, the configuration may be adopted in which each of the memory units 104 does not include the redundant bit memory. Moreover, as described in the fourth exemplary embodiment, the configuration may be adopted in which the measurement counters 106 are provided on the respective columns.

It should be noted that, according to the present exemplary embodiment, the descriptions have been given of the example in which the holding unit 123 holds the digital signal based on the noise signal, and the holding unit 124 holds the digital signal based on the photoelectric conversion signal, but other operations may be performed. For example, in a case where a gradient of the ramp signal is changed to perform the AD conversion twice with respect to the same photoelectric conversion signal, the digital signals respectively generated by the ramp signals may be respectively held in the plurality of holding units. In addition, the digital signal based on the photoelectric conversion signal of the pixels 10 on the first column may be held in the holding unit 123, and the digital signal based on the photoelectric conversion signal of the pixels 10 on the second column may be held in the holding unit 124.

In addition, the horizontal scanning unit 109 may select the memory unit M1 and the memory unit M5 at the same time. In this case, a bus through which the signal of the memory unit M1 is output and a bus through which the signal of the memory unit M5 is output are provided. The image pickup apparatus may be provided with a processing circuit to which the digital signals are respectively output from the memory unit M1 and the memory unit M5 in some cases. In this case, the processing circuit can perform processing of the digital signals respectively output from the memory unit M1 and the memory unit M5 more promptly than a case where the digital signals are sequentially read out from the memory unit M1 and the memory unit M5.

Sixth Exemplary Embodiment

With regard to the image pickup apparatus according to the present exemplary embodiment, a configuration different from that of the fifth exemplary embodiment will be mainly described.

Figure 15:
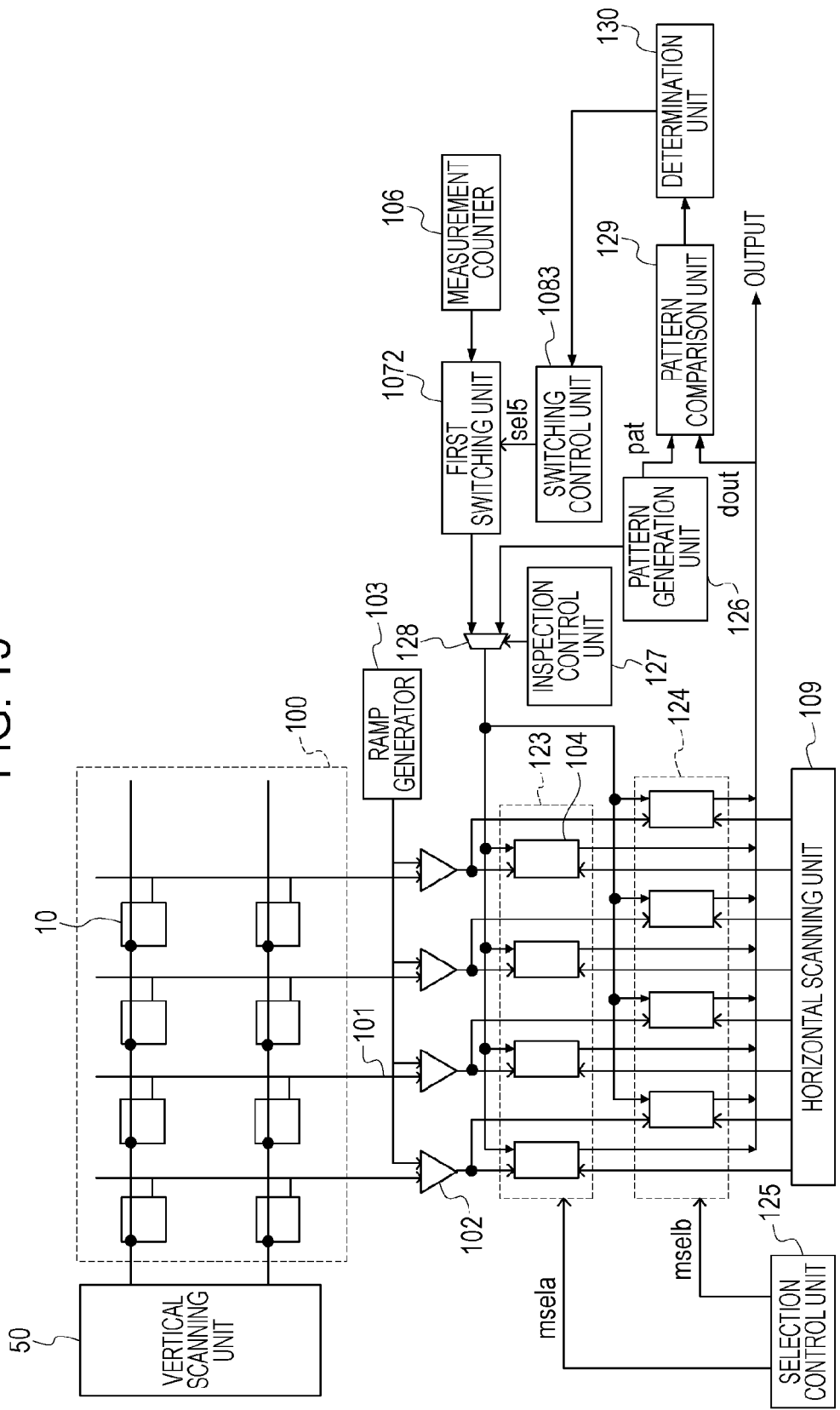
FIG. 15 illustrates an example configuration of the image pickup apparatus.

FIG. 15 illustrates the configuration of the image pickup apparatus according to the present exemplary embodiment. In FIG. 15 too, the component having the same function as that in FIG. 13 is assigned with the same reference numeral as that assigned in FIG. 13.

The image pickup apparatus according to the present exemplary embodiment includes a first switching unit 1072, a switching control unit 1083, a pattern generation unit 126, an inspection control unit 127, a selection circuit 128, a pattern comparison unit 129, and a determination unit 130.

The selection circuit 128 sets a signal output to the holding unit 123 and the holding unit 124 as either the count signal output from the first switching unit 1072 or the signal output from the pattern generation unit 126 in accordance with a signal output from the inspection control unit 127 to the selection circuit 128.

In a normal operation of the image pickup apparatus according to the present exemplary embodiment, the inspection control unit 127 outputs the signal, which is output from the first switching unit 1072 to the selection circuit 128, to the holding unit 123 and the holding unit 124. The other operations can be the same as the operations described with reference to FIG. 14 according to the fifth exemplary embodiment.

Next, an operation at the time of performing an inspection will be described. The inspection control unit 127 outputs the signal, which is output from the pattern generation unit 126 to the selection circuit 128, to the holding units 123 and 124 at the time of the inspection.

The signal output from the pattern generation unit 126 is a plural-bit digital signal in which signals of all the bits are 0 or 1. Herein, the descriptions will be given while the signal values of all the bits of the signal output from the pattern generation unit 126 are set as 1.

The holding unit 123 and the holding unit 124 hold the digital signal output from the pattern generation unit 126 via the selection circuit 128. Thereafter, when the horizontal scanning unit 109 performs the horizontal scanning, the digital signal is output from the memory unit 104 on each column to the pattern comparison unit 129. The pattern comparison unit 129 compares the digital signal with the signal output from the pattern generation unit 126. In a case where the pattern comparison unit 129 detects a bit having a signal value other than 1, the determination unit 130 determines that the bit is a defective bit. Subsequently, the determination unit 130 outputs determination information of this defective bit to the switching control unit 1083. The switching control unit 1083 sets a signal value of a signal sel5 on the basis of this determination information. Accordingly, the switching of the bits of the count signal output from the measurement counter 106 which is performed by the first switching unit 1072 is based on the determination result of the defective bit.

Next, a detail of an inspection sequence will be described with reference to the drawings.

Figure 16A:
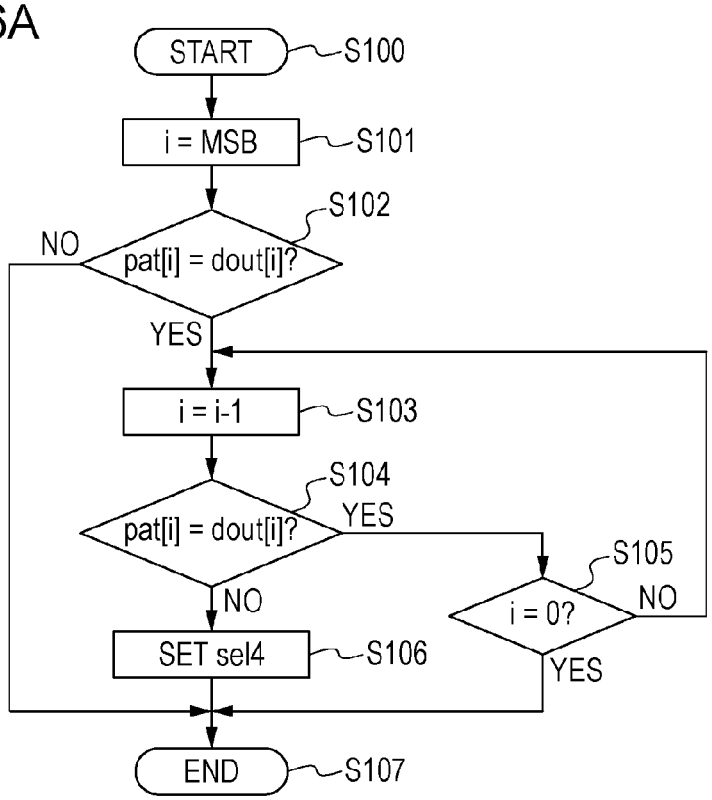
FIG. 16A is a flow chart of an example of an inspection sequence.

FIG. 16A is a flow chart illustrating an inspection sequence in a case where the redundant bit memory holds the signal of the most significant bit of the count signal as in the image pickup apparatus described with reference to FIG. 2A, FIG. 2B, and FIG. 2C according to the first exemplary embodiment.

First, in step S100, to start the inspection sequence, the count signal is output from one memory unit 104 to the pattern comparison unit 129 by the horizontal scanning of the horizontal scanning unit 109.

Next, in step S101, the pattern comparison unit 129 substitutes a most significant bit MSB including up to the redundant bit memory for a variable i. In the image pickup apparatus described with reference to FIG. 2A, FIG. 2B, and FIG. 2C, the inspection is started from the redundant bit memory.

Next, in step S102, the pattern comparison unit 129 compares a pattern signal pat[i] output from the pattern generation unit 126 with a count signal dout[i] output from the memory unit 104 to determine if the signals are matched with each other. In a case where the signals are not matched with each other, it is determined that the redundant bit memory has a defect, and the inspection sequence proceeds to step S107 to end the inspection. In this case, the image pickup apparatus is used while the memory unit 104 in which the defect is confirmed in the redundant bit memory is not used, or the image pickup apparatus is returned to a manufacturing process to fix the defect in the memory unit 104.

On the other hand, when it is determined in step S102 that the signals are matched with each other, the inspection sequence proceeds to step S103, and the variable i is set as a value having a lower order by one bit. Subsequently, in step S104, the pattern comparison unit 129 compares the pattern signal pat[i] output from the pattern generation unit 126 with the count signal dout[i] output from the memory unit 104 again to determine if the signals are matched with each other. In a case where the pattern comparison unit 129 determines in step S104 that the signals are not matched with each other, the determination unit 130 sets the signal value of the signal sel5 as a value indicating that the bit memory is not used. Thereafter, since the inspection sequence proceeds to step S107, the inspection sequence is ended. On the other hand, in a case where the pattern comparison unit 129 determines in step S104 that the signals are matched with each other, the inspection sequence proceeds to step S105.

In step S105, in a case where the variable i is not 0, the pattern comparison unit 129 returns the inspection sequence to step S103. On the other hand, in a case where the variable i is 0, the inspection sequence proceeds to step S107 to end the inspection sequence.

Figure 16B:
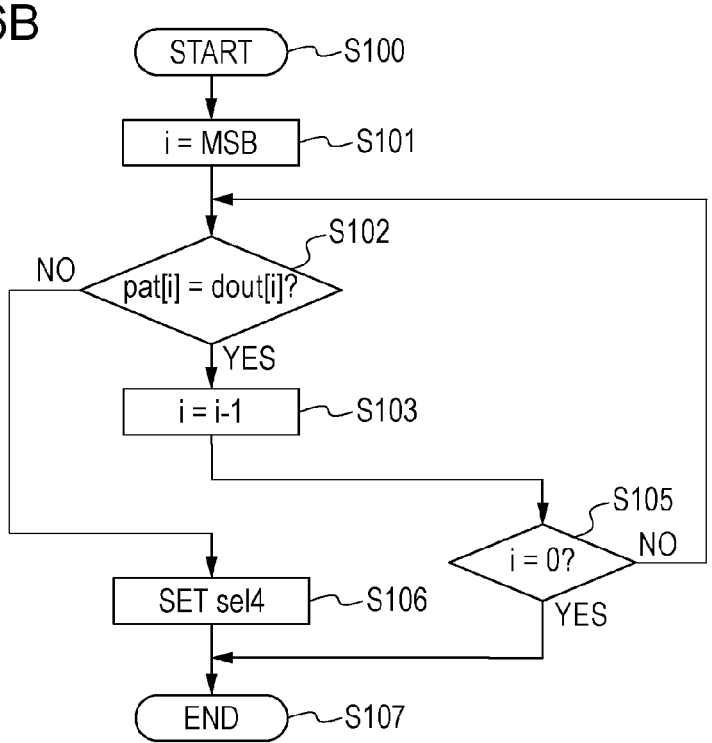
FIG. 16B is a flow chart of an example of the inspection sequence.

FIG. 16B illustrates an inspection sequence in a case where the redundant bit memory holds a signal of a least significant bit LSB of the count signal as in the image pickup apparatus described with reference to FIG. 3A, FIG. 3B, and FIG. 3C.

In FIG. 16A, the inspection sequence is ended at a time point when the redundant bit memory that is inspected in the first place has a defect, but in FIG. 16B, the inspection of the redundant bit memory is performed in the last place. Accordingly, the inspection sequence of FIG. 16B is different from the inspection sequence of FIG. 16A in that the inspection sequence proceeds to step S106 when it is determined in step S102 that the signals are not matched with each other. In addition, in the inspection sequence of FIG. 16B, in a case where the variable i is set as 0 in step S103, the inspection sequence proceeds to step S107 via step S105, and the inspection sequence is ended. Since "i=0" represents the redundant bit memory, no defect is detected in the other bit memory at a time point when the inspection sequence proceeds to step S105. Therefore, the inspection of the redundant bit memory does not need to be performed. Accordingly, in the inspection sequence of FIG. 16B, the inspection sequence is ended without performing the inspection of the redundant bit memory.

It should be noted that the inspection of the redundant bit memory is not performed in the inspection sequence of FIG. 16B, but the inspection of the redundant bit memory may be performed when necessary.

In this manner, in the image pickup apparatus according to the present exemplary embodiment, the result of the comparison between the signal input to the memory unit 104 and the signal actually held by the memory unit 104 affects the operation of the first switching unit 1072. Accordingly, the image pickup apparatus according to the present exemplary embodiment can suppress the decrease in the AD conversion accuracy caused by the defect in the memory unit 104.

Seventh Exemplary Embodiment

Descriptions will be given of an image pickup system to which the image pickup apparatus described according to the first to sixth exemplary embodiments is applied.

Figure 17A:
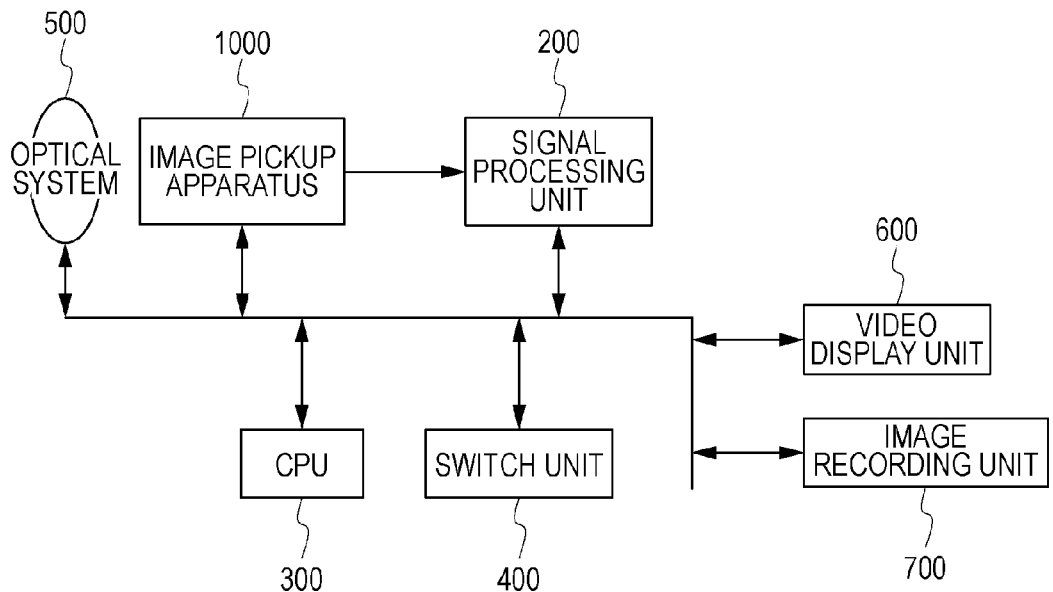
FIG. 17A illustrates an example configuration of an image pickup system.

FIG. 17A illustrates a configuration of the image pickup system. The image pickup apparatus described according to the first to sixth exemplary embodiments can be used as an image pickup apparatus 1000. Light is incident on the image pickup apparatus 1000 from an optical system 500. A signal processing unit 200 generates an image by processing a signal output from the image pickup apparatus. A CPU 300 controls the image pickup system. When an operation mode of the image pickup system and an exposure time are changed by a switch unit 400, information is input to the CPU 300 from the switch unit 400. The CPU 300 changes operations of the optical system 500, the image pickup apparatus 1000, the signal processing unit 200, a video display unit 600, and an image recording unit 700 on the basis of the information input from the switch unit 400.

Figure 17B:
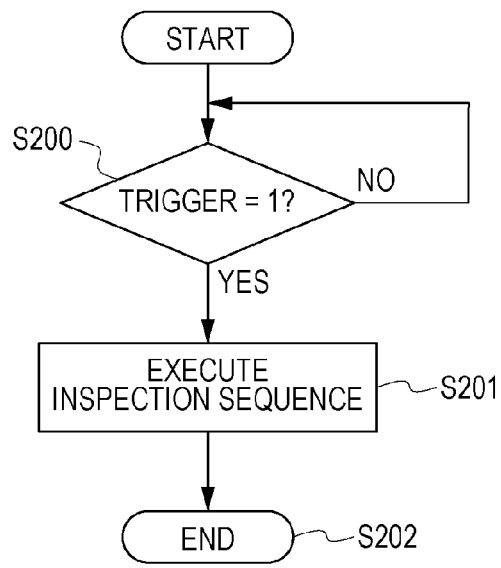
FIG. 17B is a flow chart of an example of the inspection sequence.

FIG. 17B is a flow chart for executing the inspection sequence in the image pickup system of FIG. 17A. In step S200, when a trigger=1 is established, in step S201, the inspection sequence described according to the sixth exemplary embodiment is executed. For example, the trigger may be set as 1 by a starting operation of a power supply of the image pickup system. A timer may be provided in the CPU 300, and the trigger may be set as 1 each time a predetermined period of time has elapsed.

The above-described exemplary embodiments are to explain examples of the present invention. The present invention is not limited to the above-described exemplary embodiments, and modifications, combination, and the like can be appropriately realized within the scope of the invention.

The technology is provided for suppressing the decrease in the image quality caused by the defect in the AD conversion unit while the increase in the circuit scale of the plurality of AD conversion units is suppressed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-242527, filed Nov. 28, 2014, which is hereby incorporated by reference herein in its entirety.

What is claimed is:

1. An image pickup apparatus comprising:
a plurality of pixels arranged in rows and columns, each of the pixels outputting a photoelectric conversion signal based on incident light;
a plurality of AD conversion units, each of the AD conversion units being provided to correspond to a column of the plurality of pixels and configured to convert the photoelectric conversion signal into a digital signal having plural bit signals; and
a selection unit,
wherein each of the plurality of AD conversion units includes a memory unit that holds the digital signal,
wherein the memory unit includes a first bit memory and a second bit memory, and
wherein the selection unit performs selecting a bit memory that holds the signal of a first bit signal of the digital signal, from among the first bit memory and the second bit memory, commonly in the memory unit in each of the plurality of AD conversion units.

2. The image pickup apparatus according to claim 1, wherein the memory unit further includes a plurality of bit memories each of which is configured to hold one bit signal of the digital signal, and the memory unit in each of the plurality of AD conversion units includes a redundant bit memory that holds a signal of a predetermined bit signal of the digital signal as a part of the plurality of bit memories, and
wherein the first bit memory is the redundant bit memory, and the second bit memory is a bit memory constituting another part of the plurality of bit memories.

3. The image pickup apparatus according to claim 1,
wherein the first bit signal is a bit signal having a lower order than a most significant bit signal, and
wherein the selection unit performs one of
a first operation of selecting the first bit memory as the bit memory that holds the first bit signal and selecting the second bit memory as a bit memory that holds a bit signal having a higher order than the first bit signal by one bit and
a second operation of selecting the second bit memory as the bit memory that holds the first bit signal.

4. The image pickup apparatus according to claim 1,
wherein the first bit signal is a bit signal having a lower order than a most significant bit signal, and
wherein the selection unit performs one of
a first operation of selecting the first bit memory as the bit memory that holds the first bit signal and selecting the second bit memory as a bit memory that holds a bit signal having a lower order than the first bit signal by one bit and
a second operation of selecting the second bit memory as the bit memory that holds the first bit signal.

5. The image pickup apparatus according to claim 3,
wherein the memory unit further includes a plurality of bit memories each of which is configured to hold one bit signal of the digital signal, and the memory unit in each of the plurality of AD conversion units includes a redundant bit memory that holds the signal of the predetermined bit signal of the digital signal as a part of the plurality of bit memories,
wherein the memory unit in each of the plurality of AD conversion units includes the first bit memory and the second bit memory as another part of the plurality of bit memories, and
wherein the second operation is an operation of holding the first bit signal in the second bit memory and holding the bit signal having the higher order than the first bit signal by one bit in the redundant bit memory.

6. The image pickup apparatus according to claim 4,
wherein the memory unit further includes a plurality of bit memories each of which is configured to hold one bit signal of the digital signal, and the memory unit in each of the plurality of AD conversion units includes a redundant bit memory that holds the predetermined bit signal of the digital signal as the part of the plurality of bit memories,
wherein the memory unit in each of the plurality of AD conversion units includes the first bit memory and the second bit memory as another part of the plurality of bit memories, and
wherein the second operation is an operation of holding the first bit signal in the second bit memory and holding the bit signal having the lower order than the first bit signal by one bit in the redundant bit memory.

7. The image pickup apparatus according to claim 3, further comprising:
an output unit,
wherein the output unit rearranges an order of the plural bits signals output from the memory unit that holds the digital signal by the second operation to be matched with an order of the plural bit signals output from the memory unit in a case where the digital signal is held by the first operation.

8. The image pickup apparatus according to claim 4, further comprising:
an output unit,
wherein the output unit rearranges an order of the plural bit signals output from the memory unit that holds the digital signal by the second operation to be matched with an order of the plural bit signals output from the memory unit in a case where the digital signal is held by the first operation.

9. The image pickup apparatus according to claim 1, further comprising:
a measurement counter configured to supply a count signal obtained by counting clock signals commonly to the plurality of memory units,
wherein the count signal is supplied from the measurement counter to the plurality of memory units via the selection unit.

10. The image pickup apparatus according to claim 1, wherein each of the plurality of AD conversion units further includes a measurement counter configured to supply a count signal obtained by counting clock signals to the memory unit.

11. An image pickup system comprising:
an image pickup apparatus; and
a signal processing unit configured to generate an image by processing a signal output from the image pickup apparatus,
the image pickup apparatus including
a plurality of pixels arranged in rows and columns, each of the pixels outputting a photoelectric conversion signal based on incident light, a plurality of AD conversion units, each of the AD conversion units being provided to correspond to a column of the plurality of pixels and configured to convert the photoelectric conversion signal into a digital signal having plural bit signals, and
a selection unit,
wherein each of the plurality of AD conversion units includes a memory unit that holds the digital signal,
wherein the memory unit includes a first bit memory and a second bit memory, and
wherein the selection unit performs selecting a bit memory that holds the signal of a first bit signal of the digital signal, from among the first bit memory and the second bit memory, commonly in the memory unit in each of the plurality of AD conversion units.

12. A driving method for an image pickup apparatus that includes
a plurality of pixels arranged in rows and columns, each of the pixels outputting a photoelectric conversion signal based on incident light, and
a plurality of AD conversion units, each of the AD conversion units being provided to correspond to a column of the plurality of pixels and configured to convert the photoelectric conversion signal into a digital signal having plural bit signals, in which
each of the plurality of AD conversion units includes a memory unit that holds the digital signal, and
the memory unit includes a first bit memory and a second bit memory,
the driving method comprising:
performing selection of a bit memory that holds a first bit signal of the digital signal, from among the first bit memory and the second bit memory, commonly in the memory unit in each of the plurality of AD conversion units.

13. An image pickup apparatus comprising:
a plurality of pixels arranged in rows and columns, each of the pixels outputting a photoelectric conversion signal based on incident light;
a plurality of AD conversion units, each AD conversion unit of which is provided to correspond to a column of the plurality of pixels, and configured to convert the photoelectric conversion signal into a digital signal having plural bit signals;
a first data line;
a second data line; and
a selection unit,
wherein the each AD conversion unit includes a memory unit that holds the digital signal,
wherein the memory unit includes a first bit memory and a second bit memory,
wherein the first bit memory of the AD conversion unit is connected to the first data line,
wherein the second bit memory of the AD conversion unit is connected to the second data line, and
wherein the selection unit is configured to select one of the first data line and the second data line as a data line for outputting a first bit signal of the digital signal to the memory unit of the each AD conversion unit.

14. The image pickup apparatus according to claim 13, wherein the memory unit further includes a plurality of bit memories, each of which is configured to hold one bit signal of the digital signal, and the memory unit in each of the plurality of AD conversion units includes a redundant bit memory that holds a predetermined bit signal of the digital signal as a part of the plurality of bit memories, and wherein the first bit memory is the redundant bit memory, and the second bit memory is a bit memory constituting another part of the plurality of bit memories.

15. The image pickup apparatus according to claim 13, wherein the first bit signal is a bit signal having a lower order than a most significant bit signal, and
wherein the selection unit performs one of:
a first operation of selecting the first data line as a data line for outputting the first bit signal of the digital signal to the memory unit of the each AD conversion unit, and selecting the second data line as a data line for outputting a bit signal of the digital signal having a higher order than the first bit signal to the memory unit of the each AD conversion unit, and
a second operation of selecting the first data line as a data line for outputting the first bit signal of the digital signal to the memory unit of the each AD conversion unit.

16. The image pickup apparatus according to claim 13, wherein the first bit signal is a bit signal having a lower order than a most significant bit signal, and
wherein the selection unit performs one of:
a first operation of selecting the first data line as a data line for outputting the first bit signal of the digital signal to the memory unit of the each AD conversion unit, and selecting the second data line as a data line for outputting a bit signal of the digital signal having a lower order than the first bit signal to the memory unit of the each AD conversion unit, and
a second operation of selecting the first data line as a data line for outputting the first bit signal of the digital signal to the memory unit of the each AD conversion unit.

17. The image pickup apparatus according to claim 16, wherein the memory unit further includes:
a plurality of bit memories, each of which is configured to hold one bit signal of the digital signal, and
a redundant bit memory that holds the predetermined bit signal of the digital signal as a part of the plurality of bit memories,
wherein the memory unit in the each AD conversion unit includes the first bit memory and the second bit memory as another part of the plurality of bit memories, and
wherein the second operation is an operation of holding the first bit signal in the second bit memory, and holding a bit signal of the digital signal having a higher order than the first bit signal, in the redundant bit memory.

18. The image pickup apparatus according to claim 16, wherein the memory unit further includes:
a plurality of bit memories each of which is configured to hold one bit of the digital signal, and
a redundant bit memory that holds the signal of the predetermined bit of the digital signal as the part of the plurality of bit memories,
wherein the memory unit in the each AD conversion unit includes the first bit memory and the second bit memory as another part of the plurality of bit memories, and
wherein the second operation is an operation of holding the signal of the first bit in the second bit memory, and holding a bit signal of the digital signal having a lower order than the first bit signal, in the redundant bit memory.

19. The image pickup apparatus according to claim 13, further comprising a third data line and a fourth data line, wherein the memory unit further includes:
a plurality of bit memories, each of which is configured to hold one bit signal of the digital signal,
a first redundant bit memory as the second bit memory,
a second redundant bit memory connected to the fourth data line, and
a third bit memory connected to the third data line, wherein the selection unit performs one of:
a first operation of selecting the first data line as a data line for outputting the first bit signal of the digital signal to the memory unit of the each AD conversion unit, and selecting the third data line as a data line for outputting a second bit signal of the digital signal different from the first bit signal to the memory unit of the each AD conversion unit, and
a second operation of selecting the second data line as a data line for outputting the first bit signal of the digital signal to the memory unit of the each AD conversion unit, and selecting the fourth data line as a data line for outputting the second bit signal of the digital signal to the memory unit of the each AD conversion unit.

20. The image pickup apparatus according to claim 16, further comprising:
an output unit,
wherein the output unit rearranges an order of the plural bit signals output from the memory unit that holds the digital signal by the second operation to be matched with an order of the plural bit signals output from the memory unit in a case where the digital signal is held by the first operation.

21. The image pickup apparatus according to claim 16, further comprising:
an output unit,
wherein the output unit rearranges an order of the plural bit signals output from the memory unit that holds the digital signal by the second operation to be matched with an order of the plural bit signals output from the memory unit in a case where the digital signal is held by the first operation.

22. The image pickup apparatus according to claim 17, further comprising:
an output unit,
wherein the output unit rearranges an order of the plural bit signals output from the memory unit that holds the digital signal by the second operation to be matched with an order of the plural bit signals output from the memory unit in a case where the digital signal is held by the first operation.

23. The image pickup apparatus according to claim 18, further comprising:
an output unit,
wherein the output unit rearranges an order of the plural bit signals output from the memory unit that holds the digital signal by the second operation to be matched with an order of the plural bit signals output from the memory unit in a case where the digital signal is held by the first operation.

24. The image pickup apparatus according to claim 19, further comprising:
an output unit,
wherein the output unit rearranges an order of the plural bit signals output from the memory unit that holds the digital signal by the second operation to be matched with an order of the plural bit signals output from the memory unit in a case where the digital signal is held by the first operation.

25. The image pickup apparatus according to claim 13, further comprising:
a measurement counter configured to supply a count signal obtained by counting clock signals commonly to the plurality of memory units,
wherein the count signal is supplied from the measurement counter to the plurality of memory units via the selection unit.

26. The image pickup apparatus according to claim 13, wherein each of the plurality of AD conversion units further includes a measurement counter configured to supply a count signal obtained by counting clock signals to the memory unit.

* * * * *